United States Patent
Schell

(10) Patent No.: US 8,754,678 B1
(45) Date of Patent: Jun. 17, 2014

(54) APPARATUS AND METHODS FOR INVERTIBLE SINE-SHAPING FOR PHASE INTERPOLATION

(71) Applicant: Analog Devices, Inc., Norwood, MA (US)

(72) Inventor: Robert Schell, Chatham, NJ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/835,598

(22) Filed: Mar. 15, 2013

(51) Int. Cl.
*H03B 28/00* (2006.01)
*H03B 25/00* (2006.01)
*H04L 7/033* (2006.01)
*H04L 7/06* (2006.01)

(52) U.S. Cl.
CPC ............... *H03B 25/00* (2013.01); *H04L 7/033* (2013.01); *H04L 7/06* (2013.01)
USPC .............................. 327/129; 333/20; 327/106

(58) Field of Classification Search
CPC ........... H03B 28/00; H04L 7/033; H04L 7/06
USPC ..................................... 327/105, 129; 330/20
See application file for complete search history.

(56) References Cited

U.S. PATENT DOCUMENTS

| | | | | |
|---|---|---|---|---|
| 5,121,069 A * | 6/1992 | Burns et al. | | 327/129 |
| 5,408,135 A * | 4/1995 | Choi et al. | | 327/129 |
| 5,696,796 A * | 12/1997 | Poklemba | | 375/316 |
| 5,986,483 A * | 11/1999 | Yu et al. | | 327/107 |
| 6,097,259 A * | 8/2000 | Saito et al. | | 332/103 |
| 6,356,124 B1 * | 3/2002 | Schoch | | 327/129 |
| 6,462,789 B1 * | 10/2002 | Zoso et al. | | 348/642 |
| 6,587,862 B1 * | 7/2003 | Henderson | | 708/276 |
| 6,700,367 B1 * | 3/2004 | Santos et al. | | 324/165 |
| 6,950,485 B2 * | 9/2005 | Richards et al. | | 375/355 |
| 7,577,695 B2 * | 8/2009 | Dai | | 708/271 |
| 8,065,553 B2 * | 11/2011 | Tamura et al. | | 713/600 |
| 2013/0266103 A1 * | 10/2013 | Bae et al. | | 375/354 |

* cited by examiner

*Primary Examiner* — Thomas J Hiltunen
(74) *Attorney, Agent, or Firm* — Knobbe, Martens, Olson & Bear, LLP

(57) ABSTRACT

Apparatus and methods for quadrature clock signal generation are provided. In certain implementations, an apparatus includes an invertible sine shaping filter configured to receive an in-phase clock signal, a quadrature-phase clock signal, and an inversion control signal. The invertible sine-shaping filter is further configured to filter the in-phase and quadrature-phase clock signals to generate sinusoidal in-phase and quadrature-phase clock signals. The invertible sine-shaping filter is further configured to selectively invert one or both of the in-phase and quadrature-phase clock signals based on an inversion control signal. The apparatus further includes a phase interpolator configured to generate an interpolated clock signal based on a weighted sum of the selectively inverted sinusoidal in-phase clock signal and the quadrature-phase sinusoidal clock signal. The in-phase clock signal and the quadrature-phase clock signal have a quadrature-phase relationship.

21 Claims, 16 Drawing Sheets

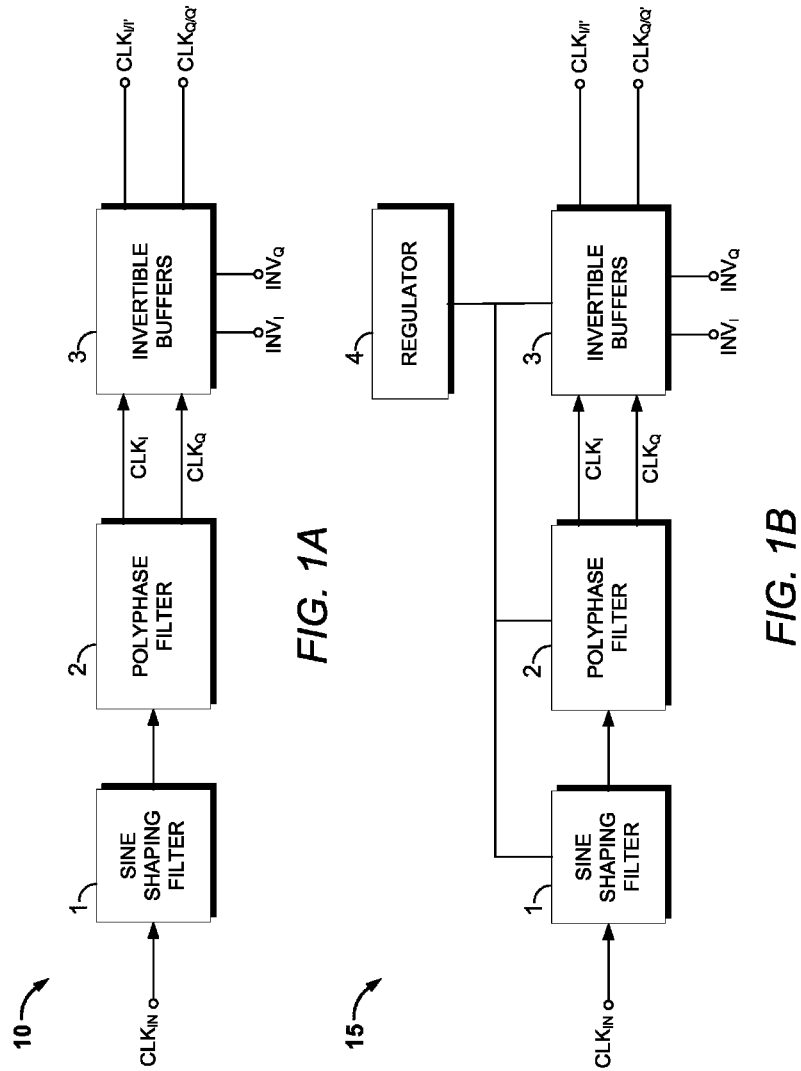

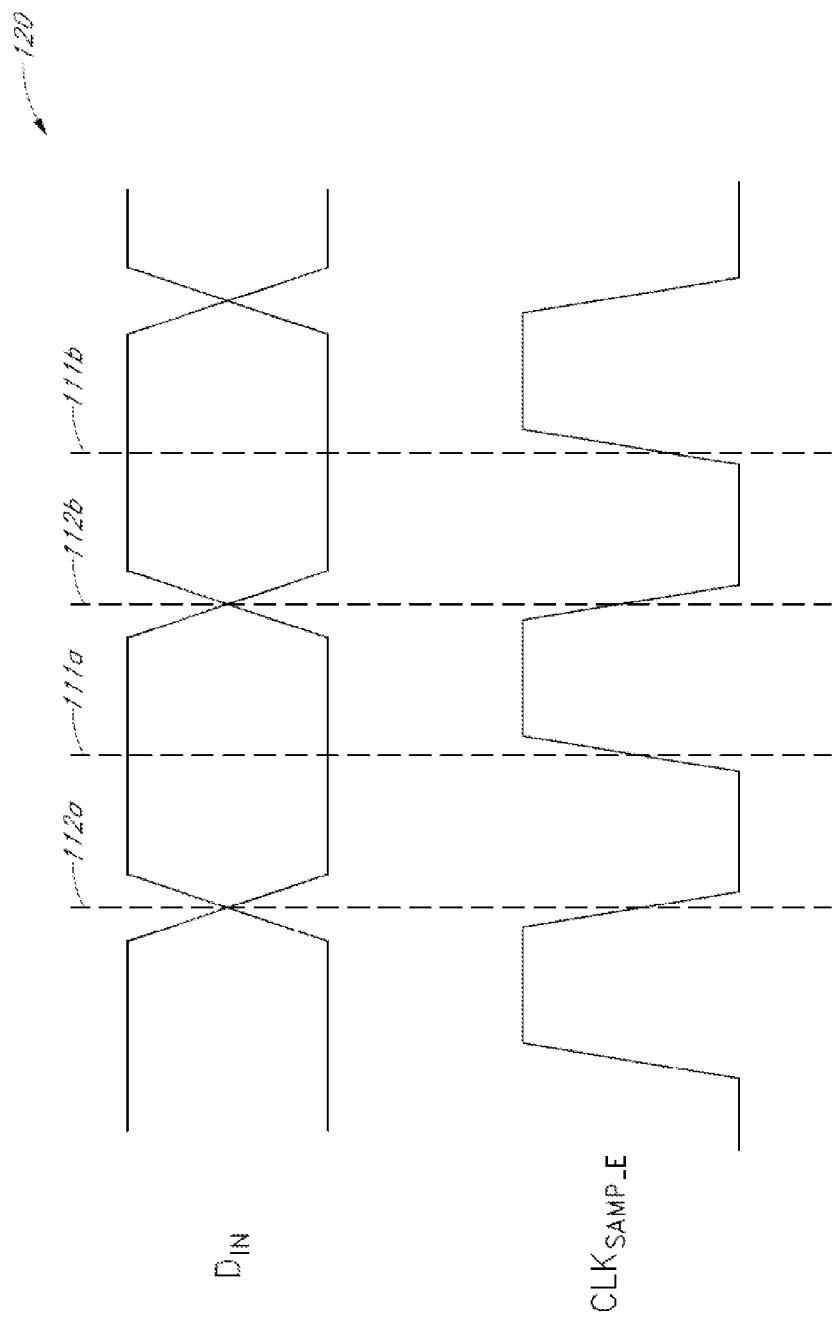

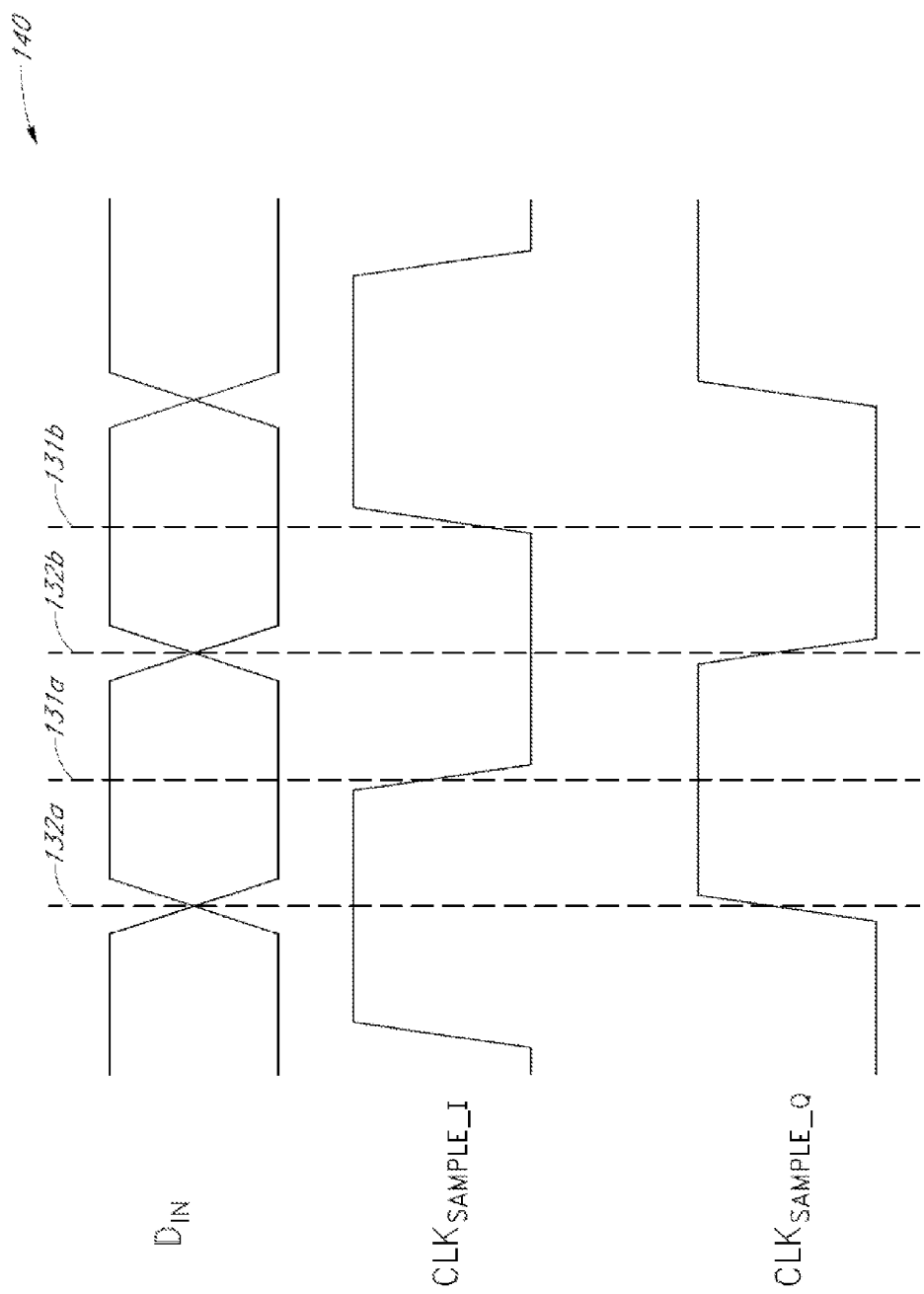

APPARATUS AND METHODS FOR INVERTIBLE SINE-SHAPING FOR PHASE INTERPOLATION

BACKGROUND

1. Field

Embodiments of the invention relate to electronic devices, and more particularly, to sine-shaping filters and phase interpolators.

2. Description of the Related Technology

Clock and data recovery (CDR) systems can be used in a variety of applications for recovering data from a high-speed serial data stream. CDR systems can be used in, for example, telecommunications systems, optical networks, and chip-to-chip communication.

A CDR system can use a sampling clock signal to capture samples from the serial data stream. The sampling clock signal can be generated in a variety of ways. For example, a CDR system can include a frequency synthesizer for generating a high speed clock signal having a frequency that is a multiple of a reference clock signal, and the CDR system can generate quadrature square wave clock signals from the high speed clock signal by using a quadrature divider. The quadrature square wave clock signals can be filtered to generate sine and cosine clock signals, which can be used to generate the sampling clock signal by weighted-based phase interpolation.

In certain applications, using a clock synthesizer and a quadrature divider to generate a sampling clock signal can be a practical method of quadrature clock signal generation. However, as data rates of CDR systems increase, the synthesizer and/or the quadrature divider can become more difficult to design, consume a relatively large amount of power, and/or occupy a relatively large die area. Additionally, for certain applications, such as radio transceiver applications, the high speed clock signal can generate undesirable coupling, pulling, and/or other forms of interference.

Similarly, in certain applications, phase interpolation can include both positive and negative weightings for each of the in-phase and quadrature-phases. As the number of weightings increases, the phase interpolator can become more difficult to design, consume a relatively large amount of power, present a relatively large load to input drivers, and/or occupy a relatively large die area. For example, interpolation buffers can consume a significant leakage power, even when inactive.

There is a need for CDR systems having improved performance. Additionally, there is need for improved systems and methods for quadrature clock signal generation.

SUMMARY

Various implementations of systems, methods and devices within the scope of the appended claims each have several aspects, no single one of which is solely responsible for the desirable attributes described herein. Without limiting the scope of the appended claims, some prominent features are described herein.

One aspect of the subject matter described in the disclosure provides an apparatus. The apparatus includes an invertible sine shaping filter configured to receive an in-phase clock signal, a quadrature-phase clock signal, and an inversion control signal. The invertible sine-shaping filter is further configured to filter the in-phase and quadrature-phase clock signals to generate sinusoidal in-phase and quadrature-phase clock signals. The invertible sine-shaping filter is further configured to selectively invert one or both of the in-phase and quadrature-phase clock signals based on an inversion control signal. The apparatus further includes a phase interpolator configured to generate an interpolated clock signal based on a weighted sum of the selectively inverted sinusoidal in-phase clock signal and the quadrature-phase sinusoidal clock signal. The in-phase clock signal and the quadrature-phase clock signal have a quadrature-phase relationship.

In an embodiment, the invertible sine shaping filter can include a buffer circuit configured to buffer the in-phase clock signal to generate an in-phase sinusoidal reference clock signal. The buffer can be further configured to buffer the quadrature-phase clock signal to generate a quadrature-phase sinusoidal reference clock signal. The in-phase sinusoidal reference clock signal and the quadrature-phase sinusoidal reference clock signal can have a quadrature-phase relationship.

In an embodiment, the apparatus can further include a sampler configured to receive a serial data stream. The sampler can be further configured to sample the serial data stream on at least one of a rising edge of a sampling clock signal or a falling edge of the sampling clock signal. The phase interpolator can be configured to generate the sampling clock signal based on the interpolated clock signal.

In various embodiments, the apparatus further includes an invert logic circuit configured to generate the inversion control signal based on the serial data stream. The invert logic circuit can be configured to modify the inversion control signal only when a weight value of the phase interpolator is within a threshold range. The phase interpolator can be further configured to determine one or more weight values based on the serial data stream.

In various embodiments, the in-phase and quadrature-phase clock signals, the sinusoidal in-phase and quadrature-phase clock signals, and the selectively inverted sinusoidal in-phase and quadrature-phase clock signals can be differential signals. The apparatus can further include a polyphase filter configured to receive a sinusoidal clock signal. The polyphase filter can be further configured to generate the in-phase clock signal and the quadrature-phase clock signal based on a rectangular wave clock signal.

In various embodiments, clock input signal can be one of a square wave clock input signal or a rectangular wave clock input signal. The clock input signal can have a first period. The in-phase sinusoidal clock signal and the quadrature-phase sinusoidal clock signal can each have a period about equal to the first period. The in-phase sinusoidal clock signal and the quadrature-phase sinusoidal clock signal can have a phase difference about equal to one quarter of the first period. The apparatus can further include a regulator configured to generate a regulated voltage. The regulator can be configured to power at least a portion of the buffer circuit using the regulated voltage.

Another aspect of the subject matter described in the disclosure provides a method of clock signal generation. The method includes filtering in-phase and quadrature-phase clock signals to generate sinusoidal in-phase and quadrature-phase clock signals. The method further includes selectively inverting one or both of the in-phase and quadrature-phase clock signals based on an inversion control signal. The method further includes generating an interpolated clock signal based on a weighted sum of the selectively inverted sinusoidal in-phase clock signal and the quadrature-phase sinusoidal clock signal. The in-phase clock signal and the quadrature-phase clock signal have a quadrature-phase relationship.

In an embodiment, the method can further include buffering the in-phase clock signal to generate an in-phase sinusoidal reference clock signal. The method can further include buffering the quadrature-phase clock signal to generate a quadrature-phase sinusoidal reference clock signal. The in-phase sinusoidal reference clock signal and the quadrature-phase sinusoidal reference clock signal can have a quadrature-phase relationship.

In various embodiments, the method can further include generating a sampling clock signal based on the interpolated clock signal and sampling a serial data stream using the sampling clock signal. The method can further include generating the inversion control signal based on the serial data stream. The method can further include modifying the inversion control signal only when a weight value is within a threshold range. The method can further include determining one or more weight values based on the serial data stream.

In various embodiments, the in-phase and quadrature-phase clock signals, the sinusoidal in-phase and quadrature-phase clock signals, and the selectively inverted sinusoidal in-phase and quadrature-phase clock signals can include differential signals. The method can further include generating an in-phase clock signal and a quadrature-phase clock signal from a sinusoidal clock signal using a polyphase filter. The clock input signal can be one of a square wave clock input signal or a rectangular wave clock input signal. The clock input signal can have a first period. The in-phase sinusoidal clock signal and the quadrature-phase sinusoidal clock signal can each have a period about equal to the first period. The in-phase sinusoidal clock signal and the quadrature-phase sinusoidal clock signal can have a phase difference about equal to one quarter of the first period.

Another aspect of the subject matter described in the disclosure provides an apparatus. The apparatus includes means for filtering in-phase and quadrature-phase clock signals to generate sinusoidal in-phase and quadrature-phase clock signals. The apparatus further includes means for selectively inverting one or both of the in-phase and quadrature-phase clock signals based on an inversion control signal. The apparatus further includes means for generating an interpolated clock signal based on a weighted sum of the selectively inverted sinusoidal in-phase clock signal and the quadrature-phase sinusoidal clock signal. The in-phase clock signal and the quadrature-phase clock signal have a quadrature-phase relationship.

Another aspect of the subject matter described in the disclosure provides a non-transitory computer-readable medium including code that, when executed, causes an apparatus to filter in-phase and quadrature-phase clock signals to generate sinusoidal in-phase and quadrature-phase clock signals. The medium further includes code that, when executed, causes the apparatus to selectively invert one or both of the in-phase and quadrature-phase clock signals based on an inversion control signal. The medium further includes code that, when executed, causes the apparatus to generate an interpolated clock signal based on a weighted sum of the selectively inverted sinusoidal in-phase clock signal and the quadrature-phase sinusoidal clock signal. The in-phase clock signal and the quadrature-phase clock signal have a quadrature-phase relationship.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 1A is a schematic block diagram illustrating one embodiment of an invertible quadrature clock signal generator.

FIG. 1B is a schematic block diagram illustrating another embodiment of an invertible quadrature clock signal generator.

FIG. 7B is a graph illustrating one example of a timing diagram for the CDR system of FIG. 7A.

FIG. 8B is a graph illustrating one example of a timing diagram for the CDR system of FIG. 8A.

DETAILED DESCRIPTION OF EMBODIMENTS

Figure 1C:
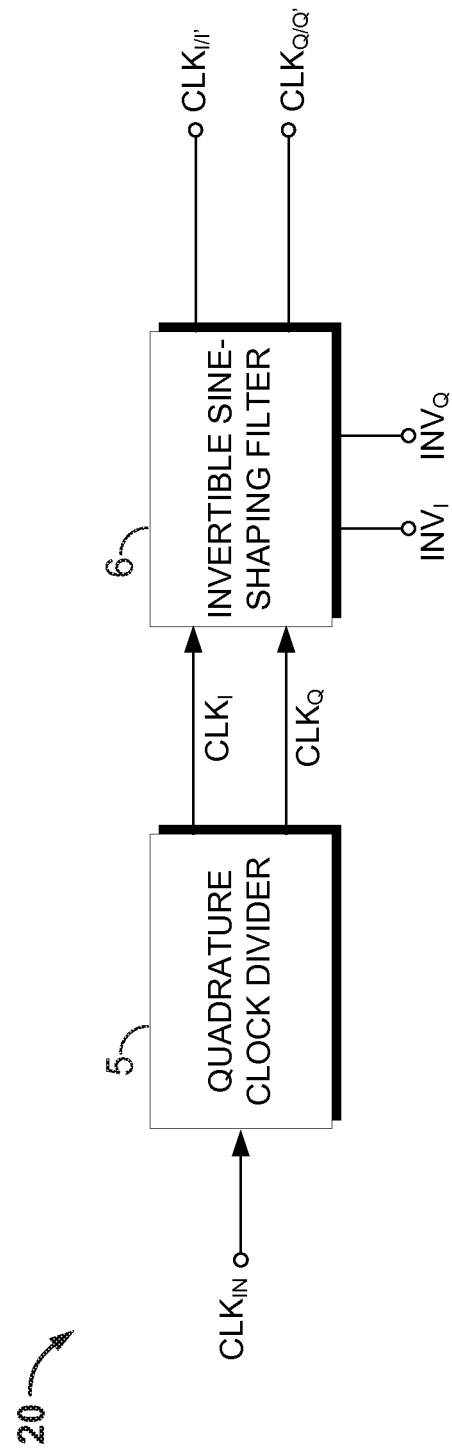
FIG. 1C is a schematic block diagram illustrating another embodiment of an invertible quadrature clock signal generator.

The following detailed description of embodiments presents various descriptions of specific embodiments of the invention. However, the invention can be embodied in a multitude of different ways as defined and covered by the claims. In this description, reference is made to the drawings where like reference numerals indicate identical or functionally similar elements.

Apparatus and methods for invertible sine-shaping and quadrature clock signal generation for phase interpolation are provided. In certain implementations, a CDR system can include an invertible sine-shaping filter or invertible quadrature clock signal generator and a phase interpolator. The invertible sine-shaping filter can receive an input clock signal such as a square or rectangular wave clock signal and can filter the input clock signal to generate an inverted or non-inverted sinusoidal clock signal. Additionally, an invertible polyphase filter can use a sinusoidal clock signal to generate in-phase (I) and quadrature-phase (Q) clock signals, which can have a quadrature-phase relationship. As used herein, clock signals having a quadrature-phase relationship can refer to clock signals having an equal period and a phase difference that is about one-quarter of the clock signals' period or about 90°. As used herein, block signals having an anti-phase relationship can refer to clock signals having an equal period and a phase difference that is about one-half of the clock signals' period or about 180°. In certain configurations, the in-phase and quadrature-phase clock signals can be buffered by an invertible buffer circuit to further generate reference clock signals suitable for use in a clock and data recover (CDR) system.

By cascading the invertible sine-shaping filter and the polyphase filter or quadrature clock divider, inverted and non-inverted quadrature sinusoidal reference clock signals can be generated from an input clock signal, such as a square or rectangular wave clock signal. Thus, a CDR system including the invertible quadrature clock signal generator can receive, for example, a single-phase at-rate rectangular wave clock signal that can be used to generate invertible in-phase and quadrature-phase sinusoidal reference clock signals from which a sampling clock signal can be generated by a simplified phase integrator. Thus, the invertible quadrature clock signal generators described herein can advantageously be used in a CDR system to provide invertible quadrature sinusoidal reference clock signals, thereby simplifying phase integration.

FIG. 1A is a schematic block diagram illustrating one embodiment of an invertible quadrature clock signal generator 10. The invertible quadrature clock signal generator 10 includes a sine-shaping filter 1, a polyphase filter 2, and an invertible buffer circuit or invertible buffers 3. As discussed below with respect to FIG. 1C, the polyphase filter 2 can be omitted in some embodiments. The invertible quadrature clock signal generator 10 further includes a clock input terminal $CLK_{IN}$, an in-phase clock inversion input terminal $INV_I$, a quadrature-phase clock inversion input terminal $INV_Q$, an in-phase sinusoidal output terminal $CLK_{I/I'}$, and a quadrature-phase sinusoidal output terminal $CLK_{Q/Q'}$.

The invertible quadrature clock signal generator 10 can be used to generate sinusoidal reference clock signals that are in a quadrature-phase relationship, such as a sine clock signal and a cosine clock signal. For example, the invertible quadrature clock signal generator 10 can generate a cosine reference clock signal on the in-phase sinusoidal output terminal $CLK_{I/I'}$ and a sine reference clock signal on the quadrature-phase sinusoidal output terminal $CLK_{Q/Q'}$. The invertible quadrature clock signal generator 10 can be configured to invert one or both of the in-phase and quadrature-phase clock signals $CLK_I$ and $CLK_Q$ based on the in-phase clock inversion input $INV_I$ and the quadrature-phase clock inversion input $INV_Q$. Although the clock input terminal $CLK_{IN}$, the in-phase sinusoidal output terminal $CLK_{I/I'}$, and the quadrature-phase sinusoidal output terminal $CLK_{Q/Q'}$ are illustrated in FIG. 1A in a single-ended configuration, the teachings herein are applicable to both singled-ended and differential configurations.

The sine-shaping filter 1 can be used to remove frequency harmonics of an input clock signal received on the clock input terminal $CLK_{IN}$. The input clock signal can be a square wave clock signal, a rectangular wave clock signal, or any other suitable periodic waveform having a fundamental frequency at a desired output clock signal frequency. Since a periodic waveform can be represented by a Fourier series of sine waves at a fundamental frequency and at harmonics thereof, the sine-shaping filter 1 can be used to filter out high frequency components of the input clock signal to generate a sinusoidal clock signal. Shaping the input clock signal using the sine-shaping filter 1 can also aid in reducing the input clock signal's duty cycle distortion by filtering out undesirable even-order harmonics. Although the sine-shaping filter 1 is described as generating a sinusoidal clock signal, the sinusoidal clock signal need not be a perfect sinusoid. In one embodiment, the generated sinusoidal clock signal can have up to about 2% total harmonic distortion. In addition, other signals described herein as "sinusoidal" also do not need to be perfect sine waves and can have similar amounts of distortion.

The polyphase filter 2 can receive the sinusoidal clock signal from the sine-shaping filter 1, and can generate in-phase and quadrature-phase clock signals ($CLK_I$ and $CLK_Q$, respectively) from the sinusoidal clock signal. As used herein, a polyphase filter can refer to an analog filter that generates quadrature output clock signals from a sinusoidal input clock signal. For example, the polyphase filter's transfer function can have one or more poles including a first pole located at a first frequency, and the polyphase filter can generate quadrature output clock signals of about equal amplitude in response to an input sinusoidal clock signal of the first frequency.

As will be described in detail further below with respect to FIGS. 3A-6, the polyphase filter 2 can include one or more stages of resistors and capacitors implemented to control the location in frequency of one or more poles of the polyphase filter's transfer function. For example, each stage of the polyphase filter 2 can be associated with a corresponding transfer function pole, and the frequency of a particular stage's pole can be controlled based on a resistor-capacitor (RC) time constant associated with the stage.

In certain implementations, the polyphase filter 2 can be a type-I polyphase filter configured to generate quadrature output clock signals in response to sinusoidal input clock signals of a wide range of frequencies, but the amplitude of the in-phase and quadrature-phase clock signals $CLK_I$ and $CLK_Q$ can be equal when the sinusoidal input clock signal's frequency is near or close to a frequency of one of the polyphase filter's poles. In other implementations, the polyphase filter 2 can be a type-II polyphase filter configured to generate output clock signals having about equal amplitude in response to sinusoidal input clock signals of a wide range of frequencies, but the phase difference between the output clock signals can be in a quadrature-phase relationship when the sinusoidal input clock signal's frequency is near a frequency of one of the polyphase filter's poles.

The resistors and capacitors used in the polyphase filter 2 can be passive components. For example, in certain implementations the resistors can be formed using polysilicon, and the capacitors can be formed using metal-oxide-metal (MOM) and/or metal-insulator-metal (MIM) capacitors. However, other configurations of the resistors and/or capacitors can be used, including, for example, implementations using active components, such as transistors.

The invertible buffers 3 can be used to buffer the in-phase and quadrature-phase clock signals $CLK_I$ and $CLK_Q$ generated by the polyphase filter 2 to generate invertible in-phase and quadrature-phase sinusoidal reference clock signals suitable for driving load circuitry as well as provide additional sine-shaping filtering. For example, the invertible buffers 3 can include selectively inverting amplification circuitry configured to buffer the in-phase and quadrature-phase clock signals $CLK_I$ and $CLK_Q$ generated by the polyphase filter 2 to generate a selectively inverted in-phase sinusoidal reference clock signal on the in-phase sinusoidal output terminal $CLK_{I/I'}$ and a quadrature-phase sinusoidal reference clock signal on the quadrature-phase sinusoidal output terminal $CLK_{Q/Q'}$. The invertible buffers 3 can be configured to invert the in-phase sinusoidal reference clock signal $CLK_I$ when the in-phase clock inversion input $INV_I$ is active, and can be configured to invert the quadrature-phase sinusoidal reference clock signal $CLK_Q$ when the quadrature-phase clock inversion input $INV_Q$ is active.

Although the invertible buffers 3 can be configured to have a relatively low gain, such as a gain in the range of about 0.8 to about 2, the invertible buffers 3 can be used to restore a signal level of the in-phase and quadrature-phase clock signals $CLK_I$ and $CLK_Q$ associated with losses of the polyphase filter 2. For example, the polyphase filter 2 can include passive elements, which can cause attenuation in the amplitude of the in-phase and quadrature-phase clock signals $CLK_I$ and $CLK_Q$ generated by the polyphase filter 2 relative to the amplitude of the sinusoidal clock signal received by the polyphase filter 2.

The illustrated invertible buffers 3 can also aid in filtering the in-phase and quadrature-phase clock signals generated by the polyphase filter 2 by operating as a low pass filter that removes undesirable output harmonic frequency components. Thus, in certain implementations, the invertible buffers can also provide additional sine-shaping or filtering so as to provide in-phase and quadrature-phase sinusoidal reference clock signals having enhanced spectral purity. Accordingly, in some embodiments, the invertible buffers 3 can also be referred to as invertible sine-shaping filters.

The invertible quadrature clock signal generator 10 can be used to provide selectively inverted quadrature sinusoidal reference clock signals to load circuitry. In certain implementations, the invertible quadrature clock signal generator 10 is included in a CDR system and is used to provide selectively inverted in-phase and quadrature-phase sinusoidal reference clock signals to a phase interpolator. As will be described in detail further below with reference to FIGS. 7A-8B, the phase interpolator can be used to generate a sampling clock signal based on a weighted sum of the inverted or non-inverted in-phase and quadrature-phase sinusoidal reference clock signals.

FIG. 1B is a schematic block diagram illustrating another embodiment of an invertible quadrature clock signal generator 15. The invertible quadrature clock signal generator 15 includes the sine-shaping filter 1, the polyphase filter 2, the invertible buffers 3, the clock input terminal $CLK_{IN}$, the in-phase clock inversion input terminal $INV_I$, the quadrature-phase clock inversion input terminal $INV_Q$, the in-phase sinusoidal output terminal $CLK_{I/I'}$, the quadrature-phase sinusoidal output terminal $CLK_{Q/Q'}$, and a regulator 4.

The invertible quadrature clock signal generator 15 of FIG. 1B is similar to the invertible quadrature clock signal generator 10 of FIG. 1A, except that the invertible quadrature clock signal generator 15 of FIG. 1B further includes the regulator 4. As shown in FIG. 1B, the regulator 4 can be used to generate a regulated voltage $V_{REG}$, which has been used to power the invertible buffers 3 at least in part. Additionally, as shown in FIG. 1B, the regulator 4 can be used to power all or part of the sine-shaping filter 1 and/or the polyphase filter 2. Including the regulator 4 can aid in controlling the amplitude of the selectively inverted in-phase and quadrature-phase sinusoidal reference clock signals generated on the in-phase and quadrature-phase sinusoidal output terminals $CLK_{I/I'}$, $CLK_{Q/Q'}$, respectively. Enhanced control over the amplitudes of the in-phase and quadrature-phase sinusoidal reference clock signals can aid in reducing error in an interpolated sinusoidal clock signal generated based on a weighted sum of the selectively inverted in-phase and quadrature-phase sinusoidal reference clock signals.

The regulator 4 can be any suitable regulator, including, for example, a low-dropout (LDO) regulator. Although the regulator 4 is illustrated in FIG. 1B as powering the sine-shaping filter 1, the polyphase filter 2, and the invertible buffers 3, other configurations are possible, such as implementations in which the regulator 4 powers only the invertible buffers 3.

FIG. 1C is a schematic block diagram illustrating another embodiment of an invertible quadrature clock signal generator 20. The invertible quadrature clock signal generator 20 includes a quadrature clock divider 5 and an invertible sine-shaping filter 6. The invertible quadrature clock signal generator 20 further includes the clock input terminal $CLK_{IN}$, the in-phase clock inversion input terminal $INV_I$, the quadrature-phase clock inversion input terminal $INV_Q$, the in-phase sinusoidal output terminal $CLK_{I/I'}$, and the quadrature-phase sinusoidal output terminal $CLK_{Q/Q'}$.

The invertible quadrature clock signal generator 20 of FIG. 1C is similar to the invertible quadrature clock signal generator 10 of FIG. 1A, except that the polyphase filter 2 is replaced with the quadrature clock divider 5, and the sine-shaping filter 1 is moved to the output stage and combined with the invertible buffers 3 to form the invertible sine-shaping filter 6. Although the clock input terminal $CLK_{IN}$, the in-phase sinusoidal output terminal $CLK_{I/I'}$, and the quadrature-phase sinusoidal output terminal $CLK_{Q/Q'}$ are illustrated in FIG. 1A in a single-ended configuration, the teachings herein are applicable to both singled-ended and differential configurations.

The quadrature clock divider 5 can receive the clock signal from the input terminal $CLK_{IN}$ and can generate in-phase and quadrature-phase clock signals ($CLK_I$ and $CLK_Q$, respectively). The input and output clock signals can be a square wave clock signal, a rectangular wave clock signal, or any other suitable periodic waveform having a fundamental frequency at a desired output clock signal frequency. In various embodiments, any quadrature clock source can be used.

The invertible sine-shaping filter 6 can be used to remove frequency harmonics of the in-phase and quadrature-phase clock signals ($CLK_I$ and $CLK_Q$, respectively) received from the quadrature clock divider 5. Since a periodic waveform can be represented by a Fourier series of sine waves at a fundamental frequency and at harmonics thereof, the invertible sine-shaping filter 6 can be used to filter out high frequency components of the clock signals $CLK_I$ and $CLK_Q$ to generate a sinusoidal clock signals $CLK_{I/I'}$ and $CLK_{Q/Q'}$, respectively. Shaping the input clock signal using the invertible sine-shaping filter 6 can also aid in reducing the input clock signal's duty cycle distortion by filtering out undesirable even-order harmonics. Although the invertible sine-shaping filter 6 is described as generating sinusoidal clock signals, the sinusoidal clock signals need not be perfect sinusoids. In one embodiment, the generated sinusoidal clock signals can have up to about 2% total harmonic distortion. In addition, other signals described herein as "sinusoidal" also do not need to be perfect sine waves and can have similar amounts of distortion.

The invertible sine-shaping filter 6 can further be used to selectively invert the in-phase and quadrature-phase clock signals $CLK_I$ and $CLK_Q$ received from the quadrature clock divider 5, based on the in-phase clock inversion input $INV_I$ and the quadrature-phase clock inversion input $INV_Q$. Particularly, the invertible sine-shaping filter 6 can be configured to invert the in-phase sinusoidal reference clock signal $CLK_I$ when the in-phase clock inversion input $INV_I$ is active, and can be configured to invert the quadrature-phase sinusoidal reference clock signal $CLK_Q$ when the quadrature-phase clock inversion input $INV_Q$ is active.

The invertible sine-shaping filter 6 can further be used to buffer the in-phase and quadrature-phase clock signals $CLK_I$ and $CLK_Q$ received from the quadrature clock divider 5. Although the invertible sine-shaping filter 6 can be configured to have a relatively low gain, such as a gain in the range of about 0.8 to about 2, the invertible sine-shaping filter 6 can be used to restore a signal level of the in-phase and quadrature-phase clock signals associated $CLK_I$ and $CLK_Q$ with losses of the quadrature clock divider 5. For example, the quadrature clock divider 5 can include passive elements, which can cause attenuation in the amplitude of the in-phase and quadrature-phase clock signals $CLK_I$ and $CLK_Q$ generated by the quadrature clock divider 5 relative to the amplitude of the sinusoidal clock signal received by the quadrature clock divider 5.

Invertible quadrature clock signal generators, such as the invertible quadrature clock signal generators 10, 15, and 20 of FIGS. 1A-1C, can be referred to herein as invertible sine-shaping quadrature clock generators (ISSQCGs).

Figure 2A:
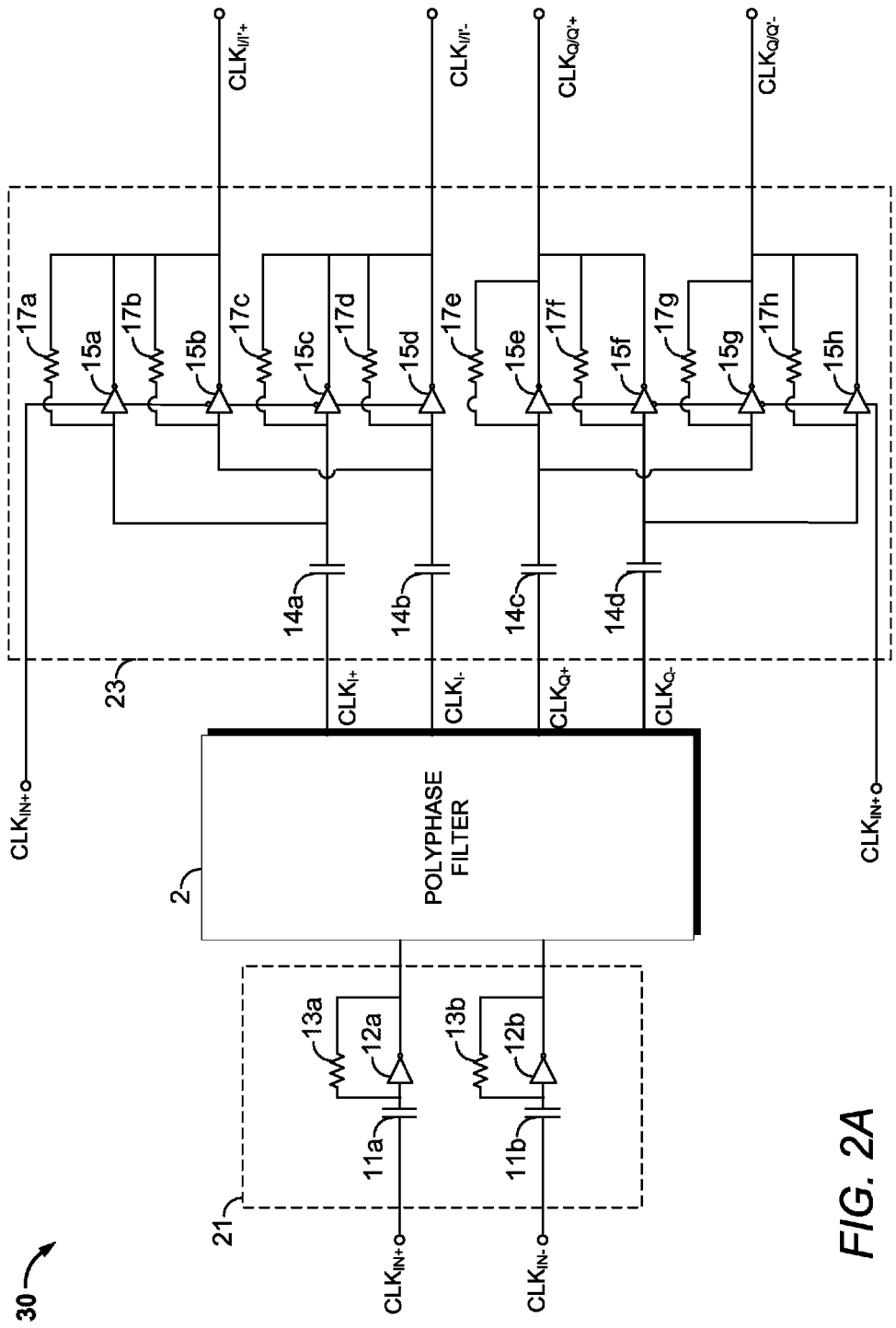
FIG. 2A is a circuit diagram illustrating one embodiment of an invertible quadrature clock signal generator.

FIG. 2A is a circuit diagram illustrating one embodiment of an invertible quadrature clock signal generator 30. The invertible quadrature clock signal generator 30 includes a sine-shaping filter 26, the polyphase filter 2, and an invertible buffer circuit or invertible buffers. The invertible quadrature clock signal generator 30 further includes a first clock input terminal $CLK_{IN+}$, a second clock input terminal $CLK_{IN-}$, the in-phase clock inversion input terminal $INV_I$, the quadrature-phase clock inversion input terminal $INV_Q$, a first in-phase sinusoidal output terminal $CLK_{I/I+}$, a second in-phase sinusoidal output terminal $CLK_{I/I-}$, a first quadrature-phase sinusoidal output terminal $CLK_{Q/Q'+}$, and a second quadrature-phase sinusoidal output terminal $CLK_{Q/Q'-}$. The invertible quadrature clock signal generator 30 illustrates one implementation of a differential invertible quadrature clock signal generator in accordance with the teachings herein.

The invertible quadrature clock signal generator 30 is configured to receive a differential input clock signal, such as a square or rectangular wave clock signal between the first and second clock input terminals $CLK_{IN+}$, $CLK_{IN-}$. The invertible quadrature clock signal generator 30 is configured to generate a differential in-phase sinusoidal reference clock signal between the first and second in-phase sinusoidal output terminals $CLK_{I/I+}$, $CLK_{I/I-}$ and to generate a differential quadrature-phase sinusoidal reference clock signal between the first and second quadrature-phase sinusoidal output terminals $CLK_{Q/Q'+}$, $CLK_{Q/Q'-}$. Additionally, the invertible quadrature clock signal generator 30 can be configured to invert one or both of the in-phase and quadrature-phase clock signals $CLK_I$ and $CLK_Q$ based on the in-phase clock inversion input $INV_I$ and the quadrature-phase clock inversion input $INV_Q$.

The sine-shaping filter 21 includes first and second capacitors 11a, 11b, first and second inverters 12a, 12b, and first and second resistors 13a, 13b. The first resistor 13a is electrically connected between an input and an output of the first inverter 12a, and the second resistor 13b is electrically connected between an input and an output of the second inverter 12b. The first capacitor 11a is electrically connected between the first clock input terminal $CLK_{IN+}$ and the input of the first inverter 12a, and the second capacitor 11b is electrically connected between the second clock input terminal $CLK_{IN-}$ and the input of the second inverter 12b. The sine-shaping filter 21 is configured to generate a differential sinusoidal clock signal for the polyphase filter 2 between the outputs of the first and second inverters 12a, 12b.

The sine-shaping filter 21 can be used to filter the differential clock signal received between the first and second clock input terminals $CLK_{IN+}$, $CLK_{IN-}$. For example, frequency roll-off of the first and second inverters 12a, 12b associated with output loading, including loading of the polyphase filter 2, can filter out high frequency components of the differential input clock signal, such as second and third harmonic frequency components. Since a square or rectangular wave signal can be represented by a Fourier series of sine waves at the wave signal's fundamental frequency and at harmonics thereof, filtering the differential input clock signal in this manner can aid in generating a differential sinusoidal clock signal using the sine-shaping filter 21.

The polyphase filter 2 can use the differential sinusoidal clock signal from the sine-shaping filter 21 to generate a differential in-phase clock signal $CLK_{I+}$, $CLK_{I-}$ and a differential quadrature-phase clock signal $CLK_{Q+}$, $CLK_{Q-}$ for the invertible buffers 23. Since a theory of operation of the polyphase filter 2 can be based on receiving an input sinusoidal clock signal, using the sine-shaping filter 21 to generate the differential sinusoidal clock signal for the polyphase filter 2 can enhance the spectral purity of the in-phase and quadrature-phase clock signals generated by the polyphase filter 2. Various embodiments of the polyphase filter 2 will be described further below with reference to FIGS. 3A-6.

The invertible buffers include first to fourth capacitors 14a-14d and first to eighth three-state inverters 15a-15h. The first capacitor 14a is disposed in a signal path between the first in-phase clock signal $CLK_{I+}$ generated by the polyphase filter 2 and a shared inverting input node of the first and third three-state inverters 15a, 15c. The second capacitor 14b is disposed in a signal path between the second in-phase clock signal $CLK_{I-}$ generated by the polyphase filter 2 and a shared inverting input node of the second and fourth three-state inverters 15b, 15d. The third capacitor 14c is disposed in a signal path between the first quadrature-phase clock signal $CLK_{Q+}$ generated by the polyphase filter 2 and a shared inverting input node of the fifth and seventh three-state inverters 15e, 15g. The fourth capacitor 14d is disposed in a signal path between the second quadrature-phase clock signal $CLK_{Q-}$ generated by the polyphase filter 2 and a shared inverting input node of the sixth and eighth three-state inverters 15f, 15h.

The in-phase clock inversion input $INV_I$ is connected to a three-state input of the first and fourth three-state inverters 15a, 15d, and to an inverting three-state input of the second and third three-state inverters 15b, 15c. The quadrature-phase clock inversion input $INV_Q$ is connected to a three-state input of the fifth and eighth three-state inverters 15e, 15h, and to an inverting three-state input of the sixth and seventh three-state inverters 15f, 15g. The first through eighth three-state inverters 15a-15h are configured to present a high-impedance output when their three-state input is active, and to invert their inverting input when their three-state input is inactive.

The first and second three-state inverters 15a, 15b are configured to selectively drive the first in-phase sinusoidal output terminal $CLK_{I/I+}$ with either the first in-phase clock signal $CLK_{I+}$ or the second in-phase clock signal $CLK_{I-}$, based on the in-phase clock inversion input $INV_I$. Likewise, the third and fourth three-state inverters 15c, 15d are configured to selectively drive the second in-phase sinusoidal output terminal $CLK_{I/I-}$ with either the first in-phase clock signal $CLK_{I+}$ or the second in-phase clock signal $CLK_{I-}$, based on the in-phase clock inversion input $INV_I$. Together, the first through fourth three-state inverters 15a-15d are configured to selectively invert the differential in-phase clock signal $CLK_{I+}$, $CLK_{I-}$ when the in-phase clock inversion input $INV_I$ is active.

The fifth and sixth three-state inverters 15e, 15f are configured to selectively drive the first quadrature-phase sinusoidal output terminal $CLK_{Q/Q'+}$ with either the fifth quadrature-phase clock signal $CLK_{Q+}$ or the second quadrature-phase clock signal $CLK_{Q-}$, based on the quadrature-phase clock inversion input $INV_Q$. Likewise, the seventh and eighth three-state inverters 15g, 15h are configured to selectively drive the second quadrature-phase sinusoidal output terminal $CLK_{Q/}$ $Q'-$ with either the first quadrature-phase clock signal $CLK_{Q+}$ or the second quadrature-phase clock signal $CLK_{Q-}$, based on the quadrature-phase clock inversion input $INV_Q$. Together, the fifth through eighth three-state inverters 15e-15h are configured to selectively invert the differential quadrature-phase clock signal $CLK_{Q+}$, $CLK_{Q-}$ when the quadrature-phase clock inversion input $INV_Q$ is active.

Moreover, the invertible buffers can be used to buffer the differential in-phase and quadrature-phase clock signals generated by the polyphase filter 2 to aid in providing quadrature sinusoidal reference clock signals to load circuitry, such as a phase interpolator of a CDR system. The invertible buffers can aid in compensating for attenuation or loss associated with generating the in-phase and quadrature-phase clock signals using the polyphase filter 2. Although not illustrated in FIG. 2A, in certain implementations the first to eighth three-state inverters 15a-15h can include voltage supplies regulated to provide a desired output voltage level of the quadrature sinusoidal reference clock signals. Additionally, in certain implementations, separate regulators are provided for powering the first through fourth three-state inverters 15a-15d and the fifth through eighth three-state inverters 15e-15h so as to compensate for different attenuations in the in-phase and quadrature-phase clock signal paths of the polyphase filter 2. Additionally, the separate regulators can be used to provide unequal amplitudes for the in-phase and quadrature-phase clock signals when using certain-phase interpolation schemes.

The illustrated invertible buffers 23 can also aid in filtering the differential in-phase and quadrature-phase clock signals generated by the polyphase filter 2 by operating as a low pass filter that removes undesirable output harmonic frequency components. Thus, in certain implementations, the invertible buffers can also provide additional sine-shaping or filtering so as to provide in-phase and quadrature-phase sinusoidal reference clock signals having enhanced spectral purity. Accordingly, in some embodiments, the invertible buffers 23 can also be referred to as invertible sine-shaping filters.

Although FIG. 2A illustrates one configuration of the sine-shaping filter 21 and the invertible buffers 23 suitable for use in the invertible quadrature clock signal generators described herein, other implementations of sine-shaping filters and/or buffers can be used, including, for example, inverting, non-inverting, and/or multi-stage configurations.

Figure 2B:
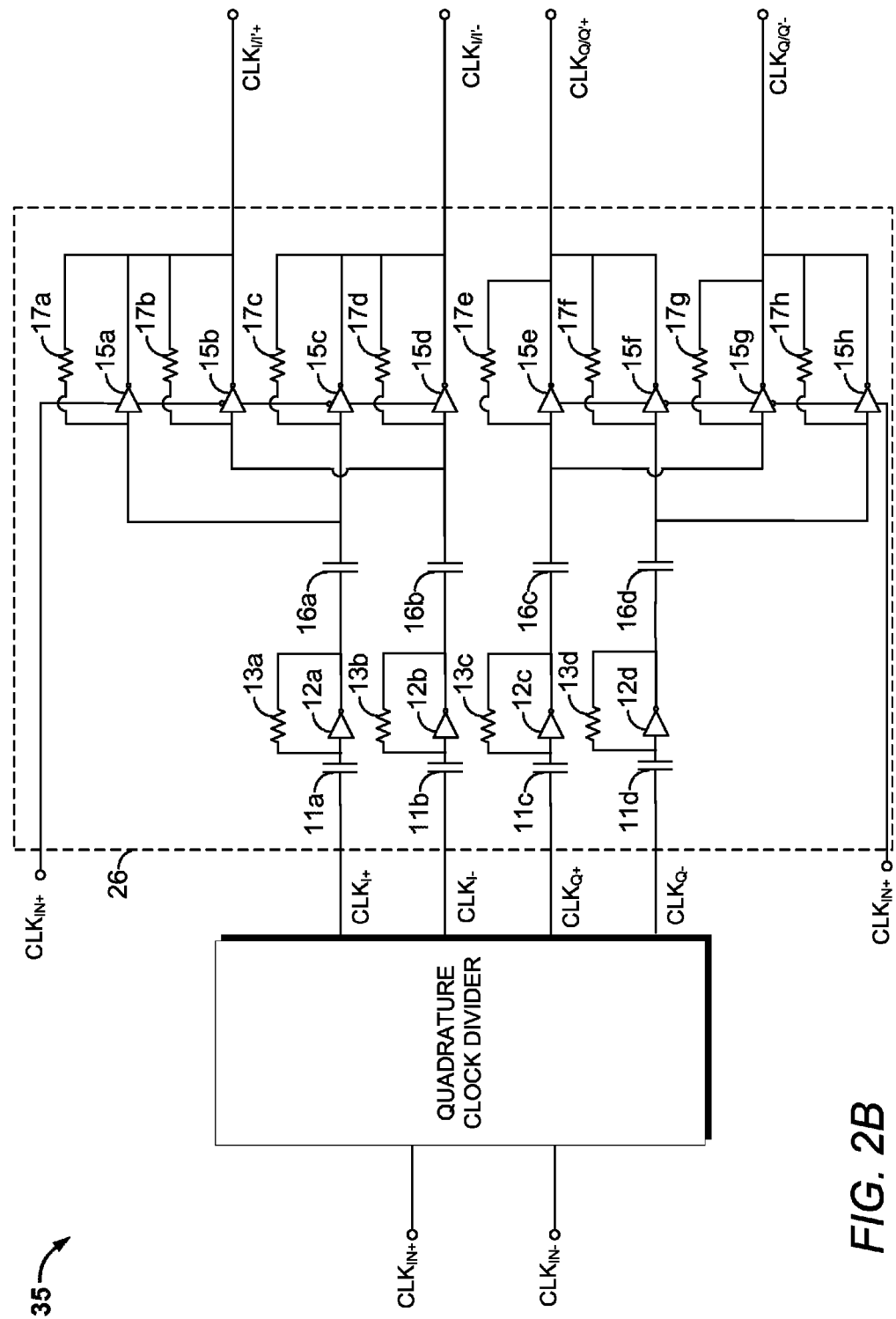
FIG. 2B is a circuit diagram illustrating another embodiment of an invertible quadrature clock signal generator.

FIG. 2B is a circuit diagram illustrating another embodiment of an invertible quadrature clock signal generator 35. The invertible quadrature clock signal generator 35 includes the quadrature clock divider 5 and an invertible sine-shaping filter 26. The invertible quadrature clock signal generator 35 further includes a first clock input terminal $CLK_{IN+}$, a second clock input terminal $CLK_{IN-}$, the in-phase clock inversion input terminal $INV_I$, the quadrature-phase clock inversion input terminal $INV_Q$, a first in-phase sinusoidal output terminal $CLK_{I/I'+}$, a second in-phase sinusoidal output terminal $CLK_{I/I'-}$, a first quadrature-phase sinusoidal output terminal $CLK_{Q/Q'+}$, and a second quadrature-phase sinusoidal output terminal $CLK_{Q/Q'-}$. The invertible quadrature clock signal generator 35 illustrates one implementation of a differential invertible quadrature clock signal generator in accordance with the teachings herein.

The invertible quadrature clock signal generator 35 of FIG. 2B is similar to the invertible quadrature clock signal generator 30 of FIG. 2A, except that the polyphase filter 2 is replaced with the quadrature clock divider 5, and the sine-shaping filter 21 is moved to the output stage and combined with the invertible buffers 23 to form the invertible sine-shaping filter 26.

The invertible quadrature clock signal generator 35 is configured to receive a differential input clock signal, such as a square or rectangular wave clock signal between the first and second clock input terminals $CLK_{IN+}$, $CLK_{IN-}$. The invertible quadrature clock signal generator 35 is configured to generate a differential in-phase sinusoidal reference clock signal between the first and second in-phase sinusoidal output terminals $CLK_{I/I'+}$, $CLK_{I/I'-}$ and to generate a differential quadrature-phase sinusoidal reference clock signal between the first and second quadrature-phase sinusoidal output terminals $CLK_{Q/Q'+}$, $CLK_{Q/Q'-}$. Additionally, the invertible quadrature clock signal generator 35 can be configured to invert one or both of the in-phase and quadrature-phase clock signals $CLK_I$ and $CLK_Q$ based on the in-phase clock inversion input $INV_I$ and the quadrature-phase clock inversion input $INV_Q$.

The quadrature clock divider 5 can receive the differential clock signal from the first and second clock input terminals $CLK_{IN+}$, $CLK_{IN-}$ and can generate a differential in-phase clock signal $CLK_{I+}$, $CLK_{I-}$ and a differential quadrature-phase clock signal $CLK_{Q+}$, $CLK_{Q-}$ for the invertible sine-shaping filter 21. The input and output clock signals can be a square wave clock signal, a rectangular wave clock signal, or any other suitable periodic waveform having a fundamental frequency at a desired output clock signal frequency. In various embodiments, any quadrature clock source can be used.

The invertible sine-shaping filter 26 includes first through fourth capacitors 11a-11d, first through fourth inverters 12a-12d, first through fourth resistors 13a-13d, fifth through eighth capacitors 16a-16d, and first through fourth three-state inverters 15a-15h. The invertible sine-shaping filter 26 can be used to filter the differential in-phase clock signal $CLK_{I+}$, $CLK_{I-}$ and a differential quadrature-phase clock signal $CLK_{Q+}$, $CLK_{Q-}$ received from the quadrature clock divider 5. For example, frequency roll-off of the first through fourth inverters 12a-12d associated with output loading can filter out high frequency components of the input signals, such as second and third harmonic frequency components. Since a square or rectangular wave signal can be represented by a Fourier series of sine waves at the wave signal's fundamental frequency and at harmonics thereof, filtering the differential in-phase clock signal $CLK_{I+}$, $CLK_{I-}$ and the differential quadrature-phase clock signal $CLK_{Q+}$, $CLK_{Q-}$ in this manner can aid in generating the differential in-phase sinusoidal reference clock signal between the first and second in-phase sinusoidal output terminals $CLK_{I/I'+}$, $CLK_{I/I'-}$ and to the differential quadrature-phase sinusoidal reference clock signal between the first and second quadrature-phase sinusoidal output terminals $CLK_{Q/Q'+}$, $CLK_{Q/Q'-}$.

The first resistor 13a is electrically connected between an input and an output of the first inverter 12a, the second resistor 13b is electrically connected between an input and an output of the second inverter 12b, the third resistor 13c is electrically connected between an input and an output of the third inverter 12c, and the fourth resistor 13d is electrically connected between an input and an output of the fourth inverter 12d. The first capacitor 11a is electrically connected between the first differential in-phase clock signal $CLK_{I+}$ and the input of the first inverter 12a, the second capacitor 11b is electrically connected between the second differential in-phase clock signal $CLK_{I-}$ and the input of the second inverter 12b, the third capacitor 11c is electrically connected between the first differential quadrature-phase clock signal $CLK_{Q+}$ and the input of the third inverter 12c, and the fourth capacitor 11d is electrically connected between the second differential quadrature-phase clock signal $CLK_{Q-}$ and the input of the fourth inverter 12d.

The fifth capacitor 16a is disposed in a signal path between the first inverter 12a and a shared inverting input node of the first and third three-state inverters 15a, 15c. The sixth capacitor 16b is disposed in a signal path between the second inverter 12b and a shared inverting input node of the second and fourth three-state inverters 15b, 15d. The seventh capacitor 16c is disposed in a signal path between the third inverter 12c and a shared inverting input node of the fifth and seventh three-state inverters 15e, 15g. The eighth capacitor 16d is disposed in a signal path between the fourth inverter 12d and a shared inverting input node of the sixth and eighth three-state inverters 15f, 15h.

The in-phase clock inversion input $INV_I$ is connected to a three-state input of the first and fourth three-state inverters 15a, 15d, and to an inverting three-state input of the second and third three-state inverters 15b, 15c. The quadrature-phase clock inversion input $INV_Q$ is connected to a three-state input of the fifth and eighth three-state inverters 15e, 15h, and to an inverting three-state input of the sixth and seventh three-state inverters 15f, 15g. The first through eighth three-state inverters 15a-15h are configured to present a high-impedance output when their three-state input is active, and to invert their inverting input when their three-state input is inactive.

The first and second three-state inverters 15a, 15b are configured to selectively drive the first in-phase sinusoidal output terminal $CLK_{II+}$ with either the first in-phase clock signal $CLK_{I+}$ or the second in-phase clock signal $CLK_{I-}$, based on the in-phase clock inversion input $INV_I$. Likewise, the second and third three-state inverters 15c, 15d are configured to selectively drive the second in-phase sinusoidal output terminal $CLK_{II-}$ with either the first in-phase clock signal $CLK_{I+}$ or the second in-phase clock signal $CLK_{I-}$, based on the in-phase clock inversion input $INV_I$. Together, the first through fourth three-state inverters 15a-15d are configured to selectively invert the differential in-phase clock signal $CLK_{I+}$, $CLK_{I-}$ when the in-phase clock inversion input $INV_I$ is active.

The fifth and sixth three-state inverters 15e, 15f are configured to selectively drive the first quadrature-phase sinusoidal output terminal $CLK_{Q/Q+}$ with either the fifth quadrature-phase clock signal $CLK_{Q+}$ or the second quadrature-phase clock signal $CLK_{Q-}$, based on the quadrature-phase clock inversion input $INV_Q$. Likewise, the sixth and seventh three-state inverters 15g, 15h are configured to selectively drive the second quadrature-phase sinusoidal output terminal $CLK_{Q/Q-}$ with either the first quadrature-phase clock signal $CLK_{Q+}$ or the second quadrature-phase clock signal $CLK_{Q-}$, based on the quadrature-phase clock inversion input $INV_Q$. Together, the fifth through eighth three-state inverters 15e-15h are configured to selectively invert the differential quadrature-phase clock signal $CLK_{Q+}$, $CLK_{Q-}$ when the quadrature-phase clock inversion input $INV_Q$ is active.

Moreover, the invertible sine-shaping filter 26 can be used to buffer the differential in-phase clock signal $CLK_{I+}$, $CLK_{I-}$ and the differential quadrature-phase clock signal $CLK_{Q+}$, $CLK_{Q-}$ generated by the quadrature clock divider 5 to aid in providing quadrature sinusoidal reference clock signals to load circuitry, such as a phase interpolator of a CDR system. The invertible sine-shaping filter 26 can aid in compensating for attenuation or loss associated with generating the in-phase and quadrature-phase clock signals using the quadrature clock divider 5. Although not illustrated in FIG. 2B, in certain implementations the first to fourth inverters 12a-12d and/or the first to eighth three-state inverters 15a-15h can include voltage supplies regulated to provide a desired output voltage level of the quadrature sinusoidal reference clock signals. Additionally, in certain implementations, separate regulators are provided for powering the first to second inverters 12a-12b, the third to fourth inverters 12c-12d, the first through fourth three-state inverters 15a-15d, and/or the fifth through eighth three-state inverters 15e-15h so as to compensate for different attenuations in the in-phase and quadrature-phase clock signal paths of the quadrature clock divider 5. Additionally, the separate regulators can be used to provide unequal amplitudes for the in-phase and quadrature-phase clock signals when using certain-phase interpolation schemes.

Although FIG. 2B illustrates one configuration of the invertible sine-shaping filter 26 suitable for use in the invertible quadrature clock signal generators described herein, other implementations of sine-shaping filters and/or buffers can be used, including, for example, inverting, non-inverting, and/or multi-stage configurations.

Figure 3A:
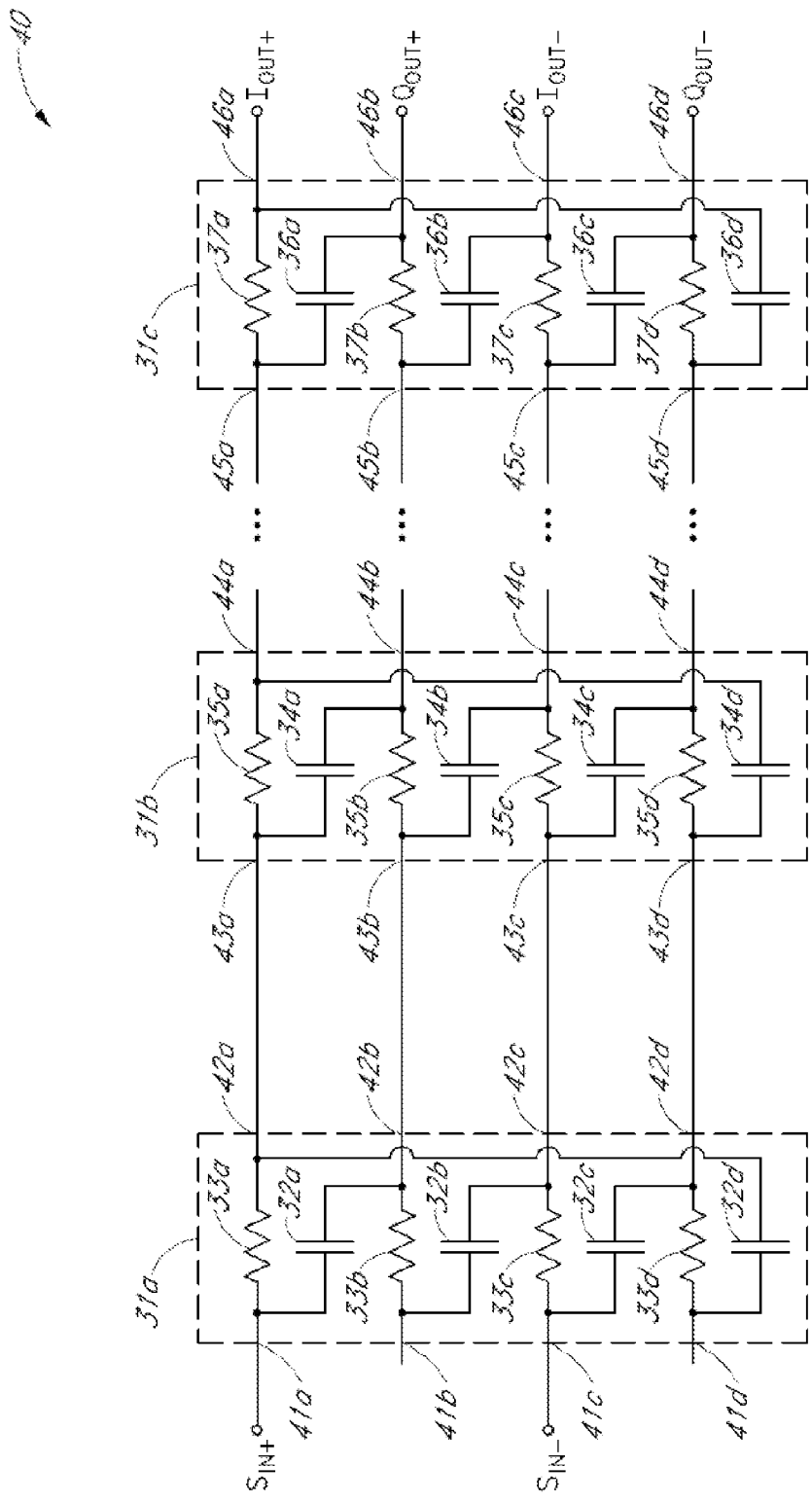
FIG. 3A is a circuit diagram illustrating one embodiment of a polyphase filter.

FIG. 3A is a circuit diagram illustrating one embodiment of a polyphase filter 40. The polyphase filter 40 includes a first stage 31a, a second stage 31b, and a third stage 31c. The polyphase filter 40 further includes a first clock input terminal $S_{IN+}$, an second clock input terminal $S_{IN-}$, a first in-phase sinusoidal output terminal $I_{OUT+}$, an second in-phase sinusoidal output terminal $I_{OUT-}$, a first quadrature-phase sinusoidal output terminal $Q_{OUT+}$, and an second quadrature-phase sinusoidal output terminal $Q_{OUT-}$.

The polyphase filter 40 can receive a differential input clock signal between the first and second clock input terminals $S_{IN+}$, $S_{IN-}$. Additionally, the polyphase filter 40 can generate a differential in-phase clock signal between the first and second in-phase sinusoidal output terminals $I_{OUT+}$, $I_{OUT-}$ and a differential quadrature-phase clock signal between the first and second quadrature-phase sinusoidal output terminals $Q_{OUT+}$, $Q_{OUT-}$.

Although FIG. 3A illustrates a configuration using three stages, the polyphase filter 40 can be adapted to include more or fewer stages in alternative embodiments. Configuring the polyphase filter 40 to include additional stages can increase a number of poles in the transfer function of the polyphase filter, which can aid in generating quadrature clock signals over a wider range of input clock signal frequencies. Configuring an invertible quadrature clock signal generator to operate over a wide range of input clock signal frequencies can be useful, for example, in CDR systems that use a sampling clock signal that operates across multiple decades of frequency. However, including a large number of stages in the polyphase filter 2 can also increase the polyphase filter's loss absent an attenuation-compensation scheme, such as inter-stage buffering.

The first to third stages 31a-31c each include first to fourth inputs and first to fourth outputs. The first and third inputs 41a, 41c of the first stage 31a are electrically connected to the first and second clock input terminal $S_{IN+}$, $S_{IN-}$, respectively. In the illustrated configuration, the second and fourth inputs 41b, 41d of the first stage 31a are unconnected to circuitry external to the first stage 31a. Additionally, the first to fourth outputs 42a-42d of the first stage 31a are electrically connected to the first to fourth inputs 43a-43d of the second stage 31b, respectively, and the first to fourth outputs 44a-44d of the second stage 31b are electrically connected to the first to fourth inputs 45a-45d of the third stage 31c, respectively. Furthermore, the first and third outputs 46a, 46c of the third stage 31c are electrically connected to the first and second in-phase sinusoidal output terminals $I_{OUT+}$, $I_{OUT-}$, respectively, and the second and fourth outputs 46b, 46d of the third stage 31c are electrically connected to the first and second quadrature-phase sinusoidal output terminals $Q_{OUT+}$, $Q_{OUT-}$, respectively.

The first stage 31a includes first to fourth resistors 33a-33d and first to fourth capacitors 32a-32d. The first resistor 33a is electrically connected between the first input 41a and the first output 42a of the first stage 31a, and the second resistor 33b is electrically connected between the second input 41b and the second output 42b of the first stage 31a. Additionally, the third resistor 33c is electrically connected between the third input 41c and the third output 42c of the first stage 31a, and the fourth resistor 33d is electrically connected between the fourth input 41d and the fourth output 42d of the first stage 31a. Furthermore, the first capacitor 32a is electrically connected between the first input 41a and the second output 42b of the first stage 31a, and the second capacitor 32b is electrically connected between the second input 41b and the third output 42c of the first stage 31a. Additionally, the third capacitor 32c is electrically connected between the third input 41c and the fourth output 42d of the first stage 31a, and the fourth capacitor 32d is electrically connected between the fourth input 41d and the first output 42a of the first stage 31a. The second stage 31b includes first to fourth resistors 35a-35d and first to fourth capacitors 34a-34d, which can be connected in a manner similar to that described above for the first stage 31a. Likewise, the third stage 31c includes first to fourth resistors 37a-37d and first to fourth capacitors 36a-36d, which can be connected in a manner similar to that described above for the first stage 31a.

In certain implementations, the resistors and the capacitors of the first to third stages 31a-31c can be passive components. For example, the resistors can be formed using resistive materials such as polysilicon or thin films geometrically sized to achieve a target resistance, while the capacitors can be formed using conductor-dielectric-conductor structures such as MOM or MIM capacitors. However, other configurations of the resistors and/or capacitors can be used, such as implementations using active transconductance ($g_m$) elements.

The first to third stages 31a-31c of the polyphase filter 40 can each add a pole to the transfer function of the polyphase filter 40. Thus, by choosing a number of stages of the polyphase filter 40, a desired number of poles in the polyphase filter's transfer function can be achieved. For example, the polyphase filter 40 can have a first pole located at a frequency associated with a RC time constant of the resistors and capacitors of the first stage 31a. For example, in a configuration in which the first to fourth resistors 33a-33d each have a resistance $R_{33}$ and the first to fourth capacitors 32a-32d each have a capacitance $C_{32}$, the polyphase filter 40 can have a first pole located at an angular frequency of about $1/(R_{33}*C_{32})$. Similarly, the polyphase filter 40 can have a second pole located at a frequency associated with a RC time constant of the resistors and capacitors of the second stage 31b and a third pole located at a frequency associated with a RC time constant of the resistors and capacitors of the third stage 31c.

The illustrated polyphase filter 40 is a type-I polyphase filter that can generate quadrature output clock signals in response to sinusoidal input clock signals of a wide range of input clock signal frequencies. For example, the differential in-phase and quadrature-phase clock signals generated by the polyphase filter 40 can have a quadrature-phase relationship even when the sinusoidal input clock signal does not have a frequency close to or near the frequency of one of the polyphase filter's poles. However, the amplitudes of the differential in-phase and quadrature-phase clock signals can be different when the input signal clock frequency is not near one of the polyphase filter's poles. In certain implementations, the locations in frequency of the poles of the polyphase filter 40 are selected to cover or span an input frequency operating range of an invertible quadrature clock signal generator such that a difference in amplitude between the differential in-phase and quadrature-phase clock signals can be relatively small across the input frequency operating range.

Figure 3B:
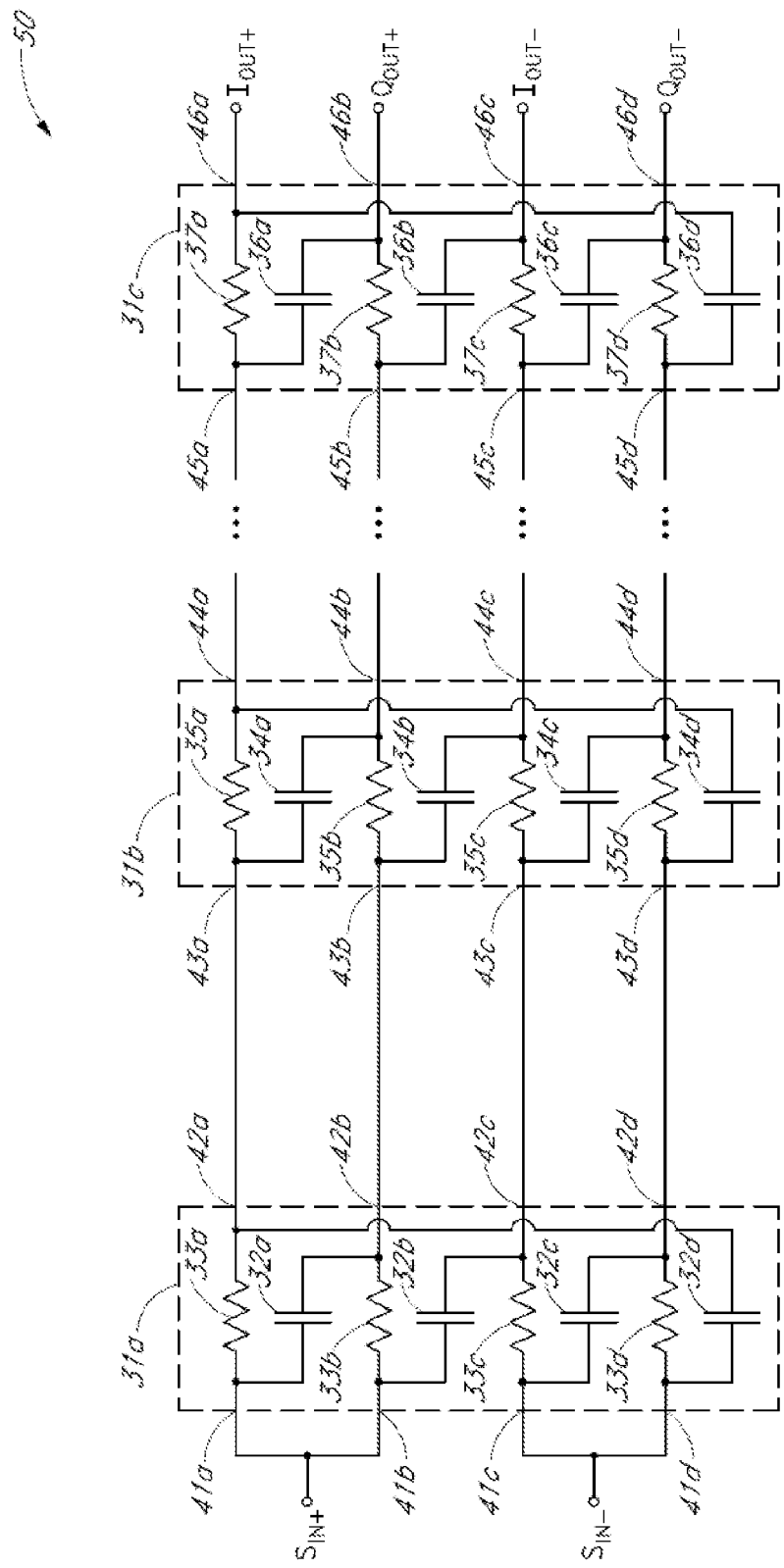
FIG. 3B is a circuit diagram illustrating another embodiment of a polyphase filter.

FIG. 3B is a circuit diagram illustrating another embodiment of a polyphase filter 50. The polyphase filter 50 includes the first to third stages 31a-31c, the first and second clock input terminals $S_{IN+}$, $S_{IN-}$, the first and second in-phase sinusoidal output terminals $I_{OUT+}$, $I_{OUT-}$, and the first and second quadrature-phase sinusoidal output terminals $Q_{OUT+}$, $Q_{OUT-}$.

The polyphase filter 50 of FIG. 3B is similar to the polyphase filter 40 of FIG. 3A, except that the inputs of the first stage 31a of the polyphase filter 50 have been connected in a different configuration relative to the inputs of the first stage 31a of the polyphase filter 40. For example, in FIG. 3B the first and second inputs 41a, 41b of the first stage 31a are electrically connected to the first clock input terminal $S_{IN+}$ and the third and fourth inputs 41c, 41d of the first stage 31a are electrically connected to the second clock input terminal $S_{IN-}$.

The polyphase filter 50 of FIG. 3B is a type-II polyphase filter that can generate output clock signals of about equal amplitude in response to sinusoidal input clock signals of a wide range of input clock signal frequencies. However, to ensure a quadrature-phase relationship between the output clock signals, the input signal frequency should be near one of the polyphase filter's poles. In certain implementations, the locations in frequency of the poles of the polyphase filter 50 are selected to cover or span an input frequency operating range of an invertible quadrature clock signal generator such that a difference in-phase between the differential in-phase and quadrature-phase clock signals is about equal to 90° across the input frequency operating range.

Figure 4:
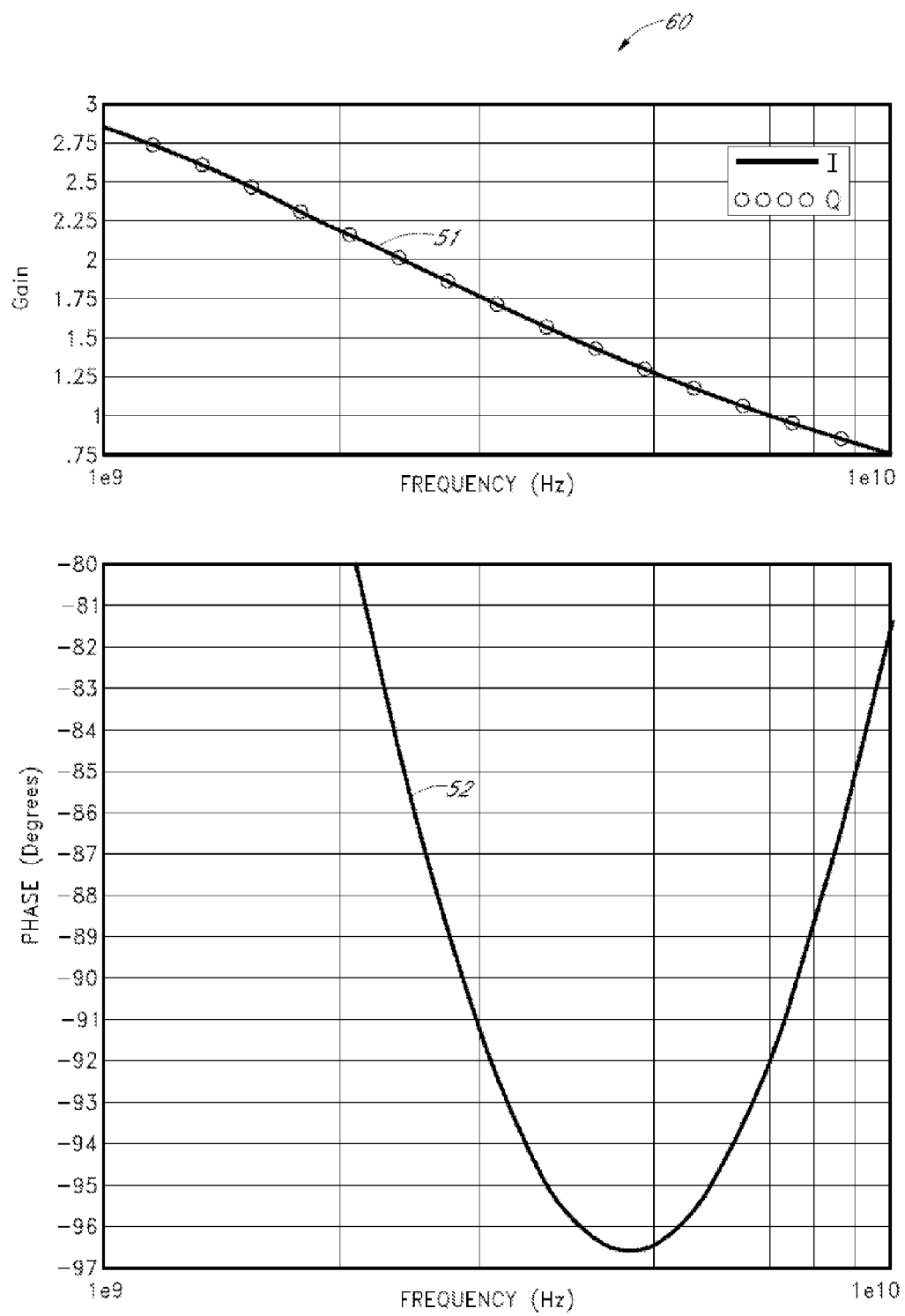
FIG. 4 is a graph illustrating one example of gain and phase versus frequency for a polyphase filter.

FIG. 4 is a graph 60 illustrating one example of gain and phase versus frequency for a polyphase filter. The graph 60 includes a gain plot 51 and a phase plot 52 for one implementation of the polyphase filter of FIG. 3B having two stages with corresponding poles at about 3 GHz and about 7.7 GHz, respectively. The gain plot 51 illustrates gain of in-phase and quadrature-phase clock signals and the phase plot 52 corresponds to a difference in-phase between the in-phase and quadrature-phase clock signals. As shown in the FIG. 4, the polyphase filter can provide a relatively equal gain to both in-phase and quadrature-phase paths, and a phase within about +/−10% of 90° for input sinusoidal clock signals spanning a targeted operating frequency band between about 3.6 GHz and about 6.2 GHz.

Figure 5:
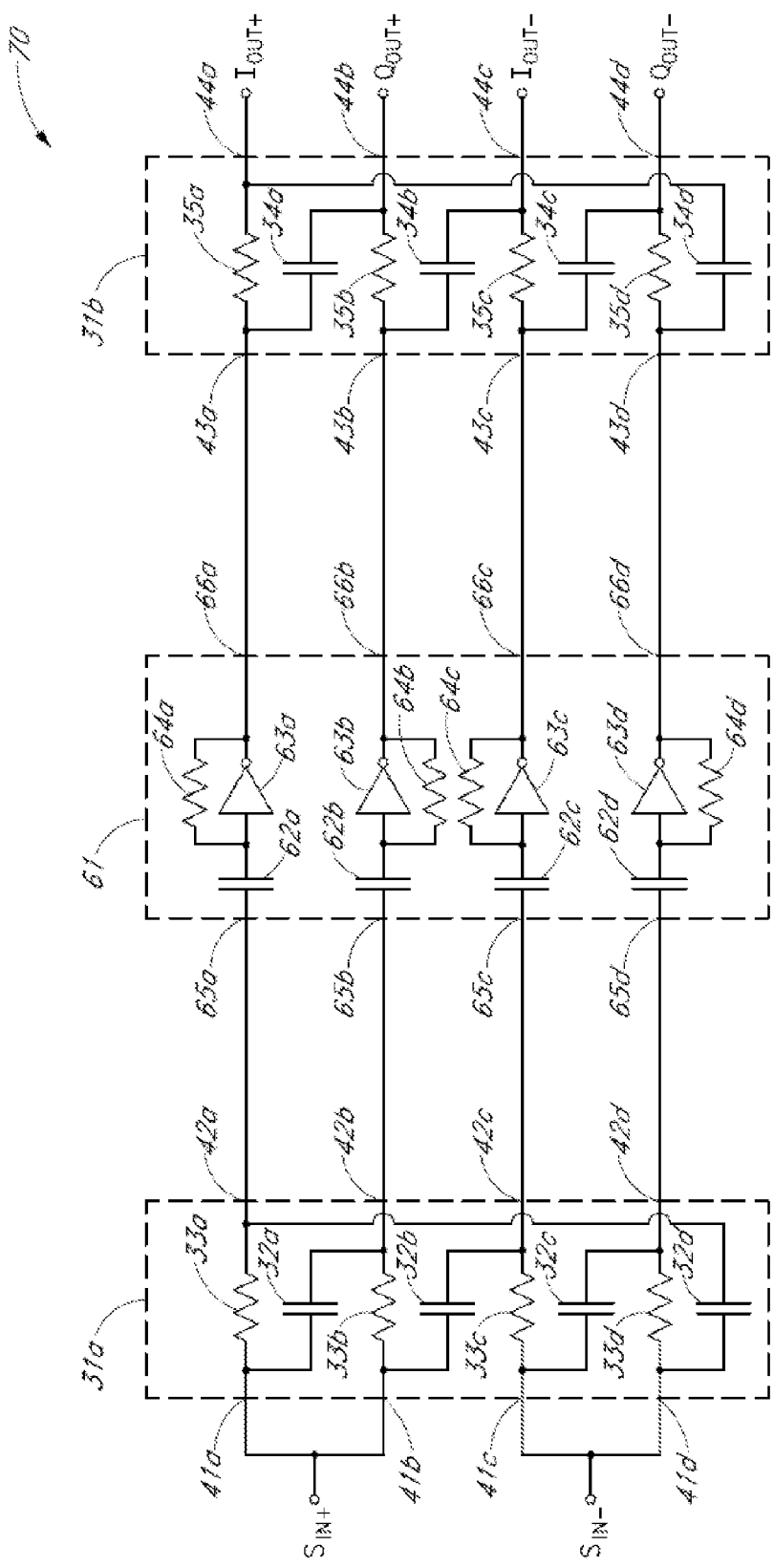
FIG. 5 is a circuit diagram illustrating another embodiment of a polyphase filter.

FIG. 5 is a circuit diagram illustrating another embodiment of a polyphase filter 70. The polyphase filter 70 includes the first and second stages 31a, 31b, the first and second clock input terminals $S_{IN+}$, $S_{IN-}$, the first and second in-phase sinusoidal output terminals $I_{OUT+}$, $I_{OUT-}$, the first and second quadrature-phase sinusoidal output terminals $Q_{OUT+}$, $Q_{OUT-}$, and inter-stage buffers 61.

The polyphase filter 70 of FIG. 5 is similar to the polyphase filter 50 of FIG. 3B, except that the polyphase filter 70 of FIG. 5 illustrates a two-stage configuration omitting the third stage 31c. Additionally, the polyphase filter 70 further includes the inter-stage buffer circuit or buffers 61.

The inter-stage buffer circuit 61 operates as a buffer between the first to fourth outputs 42a-42d of the first stage 31a and the first to fourth inputs 43a-43d of the second stage 31b. The inter-stage buffer circuit 61 includes first to fourth inputs 65a-65d electrically connected to the first to fourth outputs 42a-42d of the first stage 31a, respectively, and first to fourth outputs 66a-66d electrically connected to the first to fourth inputs 43a-43d of the second stage 31b, respectively.

Additionally, the inter-stage buffer circuit 61 further includes first to fourth capacitors 62a-62d, first to fourth inverters 63a-63d and first to fourth resistors 64a-64d. The first resistor 64a is electrically connected between an input and an output of the first inverter 63a, and the second resistor 64b is electrically connected between an input and an output of the second inverter 63b. Similarly, the third resistor 64c is electrically connected between an input and an output of the third inverter 63c, and the fourth resistor 64d is electrically connected between an input and an output of the fourth inverter 63d. The first to fourth capacitors 62a-62d are electrically connected between the first to fourth inputs 65a-65d of the inter-stage buffer circuit 61 and the inputs of the first to fourth inverters 63a-63d, respectively. The outputs of the first to fourth inverters 63a-63d operate as the first to fourth outputs 66a-66d of the inter-stage buffer circuit 61, respectively.

The inter-stage buffer circuit 61 can be used to buffer signals generated by the first stage 31a and to provide the buffered signals to the second stage 31b. The inter-stage buffer circuit 61 can compensate for attenuation or loss associated with the first stage 31a. The inter-stage buffer circuit 61 can also aid in enhancing the filtering of the polyphase filter and/or achieving output swing requirements. Although not illustrated in FIG. 5, in certain implementations the first to fourth inverters 63a-63d can include voltage supplies regulated to provide a desired output voltage level.

Although FIG. 5 illustrates one configuration of inter-stage buffers, other implementations can be used, including, for example, inverting, non-inverting, and/or multi-stage configurations. Additionally, although FIG. 5 illustrates a polyphase filter including two stages with inter-stage buffers between the two stages, additional inter-stage buffers can be used for configurations including more stages. For example, when using a configuration with three of more stages, inter-stage buffers can be used between all or some of the stages.

Figure 6:
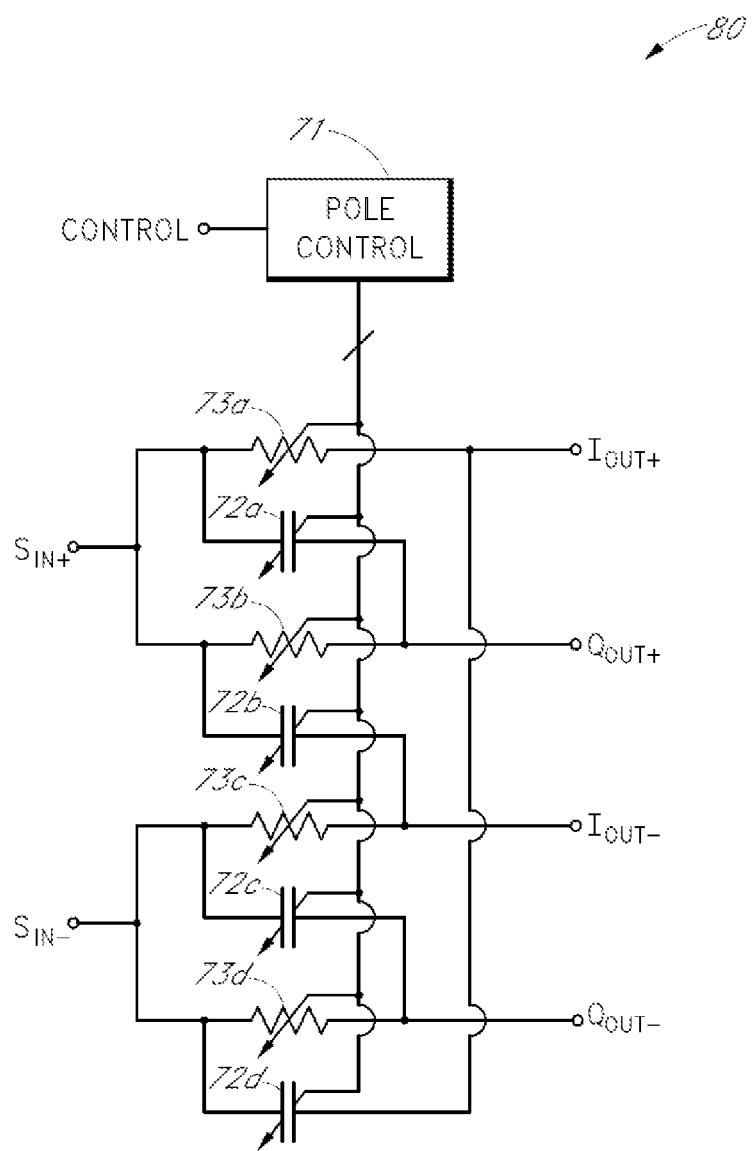
FIG. 6 is a circuit diagram illustrating another embodiment of a polyphase filter.

FIG. 6 is a circuit diagram illustrating another embodiment of a polyphase filter 80. The polyphase filter 80 includes the first and second clock input terminals $S_{IN+}$, $S_{IN-}$, the first and second in-phase sinusoidal output terminals $I_{OUT+}$, $I_{OUT-}$, the first and second quadrature-phase sinusoidal output terminals $Q_{OUT+}$, $Q_{OUT-}$, and a control terminal CONTROL. The polyphase filter 80 further includes first to fourth variable resistors 73a-73d, first to fourth variable capacitors 72a-72d, and a pole control block 71.

The first and second variable resistors 73a, 73b are electrically connected between the first clock input terminal $S_{IN+}$ and the first in-phase and first quadrature-phase sinusoidal output terminals $I_{OUT+}$, $Q_{OUT+}$, respectively. The third and fourth variable resistors 73c, 73d are electrically connected between the second clock input terminal $S_{IN-}$ and the second in-phase and second quadrature-phase sinusoidal output terminals $I_{OUT-}$, $Q_{OUT-}$, respectively. The first and second variable capacitors 72a, 72b are electrically connected between the first clock input terminal $S_{IN+}$ and the first quadrature-phase and second in-phase sinusoidal output terminals $Q_{OUT+}$, $I_{OUT-}$, respectively. Additionally, the third and fourth variable capacitors 72c, 72d are electrically connected between the second clock input terminal $S_{IN-}$ and the second quadrature-phase and first in-phase sinusoidal output terminals $Q_{OUT-}$, $I_{OUT+}$, respectively.

The pole control block 71 can be used to control the resistance of the first to fourth variable resistors 73a-73d and/or the capacitance of the first to fourth variable capacitors 72a-72d based on control information received on the control terminal CONTROL. The control information can include data indicative of an input signal frequency of the sinusoidal clock input signal received by the polyphase filter 80. Additionally, the pole control block 71 can select the resistances of the variable resistors and/or the capacitances of the variable capacitors so as to control a location in frequency of the polyphase filter's pole. Since the output clock signals generated by the polyphase filter 80 can have a quadrature-phase relationship when the input clock signal frequency is close to the frequency of the pole of the polyphase filter 80, the pole control block 71 can be used to move or change the location of the polyphase filter's pole in relation to the input signal frequency. Thus, the illustrated polyphase filter 80 can be used in systems having need for quadrature sinusoidal reference clock signals spanning a relatively wide band of frequency, such as a band including multiple decades of frequency.

The first to fourth variable resistors 73a-73d and the first to fourth variable capacitors 72a-72d can be implemented in any suitable manner. In one embodiment, the first to fourth variable resistors 73a-73d include field-effect transistors having a channel resistance configured to change in response to a gate bias voltage. In another embodiment, the first to fourth variable capacitors 72a-72d include field-effect transistors having a gate-to-source capacitance configured to change in response to a gate bias voltage. Although one suitable implementation of the first to fourth variable resistors 73a-73d and the first to fourth variable capacitors 72a-72d has been described, other configurations can be used.

Although FIG. 6 illustrates a configuration of the polyphase filter 80 in which the frequency of the polyphase filter's pole is controlled using both variable resistors and variable capacitors, implementations using variable resistors and fixed capacitors or implementations using fixed resistors and variable capacitors can be used. Additionally, although a polyphase filter with a controllable or movable pole location has been described in the context of a type-II polyphase filter, polyphase filters including a movable pole can be implemented in a type-I polyphase filter configuration.

Figure 7A:
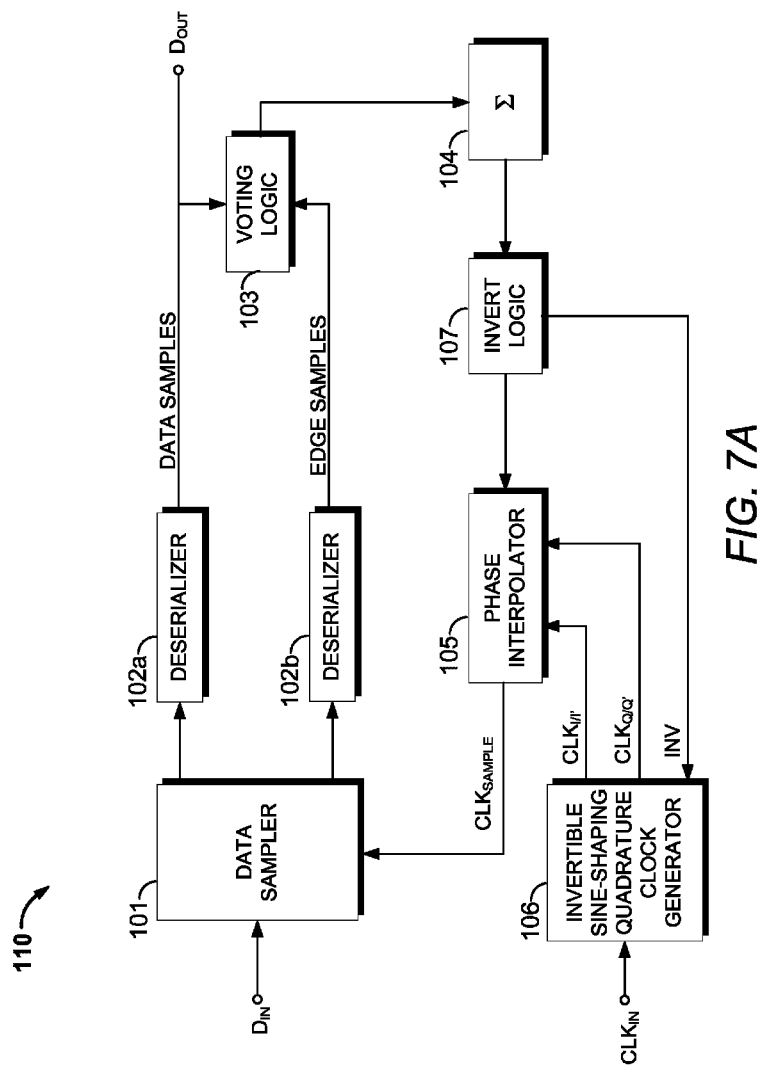
FIG. 7A is a schematic block diagram of one embodiment of a clock and data recovery (CDR) system.

FIG. 7A is a schematic block diagram of one embodiment of a CDR system 110. The CDR system 110 includes a data sampler 101, a first deserializer 102a, a second deserializer 102b, voting logic 103, an accumulator 104, a phase interpolator 105, an invertible quadrature clock signal generator or invertible sine-shaping quadrature clock generator (ISSQCG) 106, and invert logic 107. The CDR system 110 further includes a clock input terminal $CLK_{IN}$, a data input terminal $D_{IN}$, and a data output terminal $D_{OUT}$. The CDR system 110 illustrates one example of a CDR system in which the invertible quadrature clock signal generators described herein can be used.

The sampler 101 can be used to sample a serial data stream received on the data input terminal $D_{IN}$ on edges of a sampling clock signal $CLK_{SAMPLE}$. The serial data stream can include a string of serial data bits that transition at a data rate. At a given data rate, the serial data stream has a unit interval (UI), or minimum time interval between transitions of the serial data stream. The samples taken by the sampler 101 can include not only data samples, but also edge samples of the serial data stream used to lock the CDR system 110 to the serial data stream. When the CDR system 110 is in a locked condition, the samples can be taken from specific positions into the UI of the serial data stream. A rising edge of the sampling clock signal $CLK_{SAMPLE}$ can be used to capture data samples and a falling edge of the sampling clock signal $CLK_{SAMPLE}$ can be used to capture edge samples or vice versa.

In the illustrated configuration, the sampler 101 has been configured to provide data samples to the first deserializer 102a and edge samples to the second deserializer 102b. The first and second deserializers 102a, 102b can be used to deserialize the samples captured by the data sampler 101. The first deserializer 102a is configured to provide the deserialized data samples to the data output terminal $D_{OUT}$ and to the voting logic 103, and the second deserializer 102b is configured to provide the deserialized edge samples to the voting logic 103. By deserializing the samples captured by the sampler 101, the first and second deserializers 102a, 102b can provide the captured samples to processing circuitry at a reduced bit rate, thereby relaxing an operating frequency design constraint of the processing circuitry. In one embodiment the first and second deserializers 102a, 102b each receive a stream of samples and the deserializers 102a, 102b deserialize the streams by a factor of 10 or more.

The voting logic 103, the accumulator 104, and the invert logic 107 can be used to control the phase interpolator 105 based on the deserialized data and edge samples. For example, the voting logic 103 can increase or decrease a value stored in the accumulator 104 used to control a phase of the sampling clock signal $CLK_{SAMPLE}$. The voting logic 103 can be used to process timing of data transitions between the edge and data samples so as to shift the sampling clock signal $CLK_{SAMPLE}$ earlier or later in time to align the clock signal $CLK_{SAMPLE}$ relative to the unit interval of the serial data stream. In certain implementations, the accumulator 104 is a digital wrapping accumulator. As will be described in greater detail below, the invert logic 107 can rewrite commands from the accumulator to account for the invertible nature of the ISSQCG 106.

The illustrated ISSQCG 106 generates quadrature sinusoidal reference clock signals for the CDR system 110. For example, the invertible quadrature clock signal generator 106 is configured to receive an input clock signal on the clock input terminal $CLK_{IN}$ and to generate an in-phase sinusoidal reference clock signal $CLK_{I/I'}$ and a quadrature-phase sinusoidal reference clock signal $CLK_{Q/Q'}$ for the phase interpolator 105. The input clock signal can be, for example, a square or rectangular wave clock signal. The ISSQCG 106 can be configured to invert one or both of the in-phase sinusoidal reference clock signal $CLK_{I/I'}$ and the quadrature-phase sinusoidal reference clock signal $CLK_{Q/Q'}$ based on inversion commands from the invert logic 107. In various embodiments, the ISSQCG 106 can include the invertible quadrature clock signal generator 10, 15, or 20, described above with respect to FIGS. 1A-1C.

The phase interpolator 105 can be used to generate the sampling clock signal $CLK_{SAMPLE}$ by interpolating the in-phase sinusoidal reference clock signal $CLK_{I/I'}$ and the quadrature-phase sinusoidal reference clock signal $CLK_{Q/Q'}$ based on control information received from the accumulator 104, which can be rewritten by the invert logic 107. In various embodiments, the voting logic 103, the accumulator 104, or another circuit or processor can implement the invert logic 107.

In certain implementations, the phase interpolator 105 is implemented to generate an interpolated clock signal $CLK_{INTERP}$ based on a weighted sum of the in-phase and quadrature-phase sinusoidal reference clock signals $CLK_{I/I'}$, $CLK_{Q/Q'}$. For example, the phase interpolator 105 can generate the interpolated clock signal $CLK_{INTERP}$ based on Equation 1 below.

$$CLK_{INTERP} = A \times CLK_I + B \times CLK_Q \qquad \text{Equation 1}$$

In Equation 1 above, the interpolated clock signal $CLK_{INTERP}$ has been generated based on weighting or multiplying the in-phase sinusoidal reference clock signal $CLK_{I/I'}$ by a first factor A and the quadrature-phase sinusoidal reference clock signal $CLK_{Q/Q'}$ by a second factor B. By selecting the values of the first and second factors A, B a sinusoidal signal of a desired phase can be generated. For example, in a configuration in which the in-phase sinusoidal reference clock signal $CLK_{I/I'}$ has a value $\cos(\omega t)$ and the quadrature-phase sinusoidal reference clock signal $CLK_{Q/Q'}$ has a value $\sin(\omega t)$, the interpolated clock signal $CLK_{INTERP}$ can have a value determined from Equation 2 below.

$$CLK_{INTERP} = \sqrt{A^2 + B^2} \times \cos(\omega t + \theta) \qquad \text{Equation 2}$$

In Equation 2 above, the interpolated clock signal $CLK_{INTERP}$ is a sinusoidal clock signal having an amplitude of about $$\sqrt{A^2 + B^2}$$

and a phase of $\theta$, where $\theta$ is about equal to $\arctan(B/A)$. By controlling the magnitudes of the first and second factors A, B, a sinusoidal clock signal of a desired phase can be generated. In one embodiment, the phase interpolator 105 includes a look-up table including values of the first and second factors A, B associated with different phase shifts. Additionally, the values in the look-up table are selected such that the amplitude $$\sqrt{A^2 + B^2}$$

of the interpolated sinusoidal clock signal is approximately constant for different phase values. Exemplary phase shifts and corresponding first and second factors A, B are shown in Table 1, below.

TABLE 1

| Phase | A | B |
|---|---|---|
| 0 | 0 | 20 |
| 1 | 2 | 20 |
| 2 | 4 | 20 |
| 3 | 6 | 20 |
| 4 | 8 | 19 |
| 5 | 9 | 17 |
| 6 | 11 | 17 |
| 7 | 13 | 16 |
| 8 | 14 | 14 |
| 9 | 16 | 13 |
| 10 | 17 | 11 |
| 11 | 17 | 9 |
| 12 | 19 | 8 |
| 13 | 20 | 6 |
| 14 | 20 | 4 |
| 15 | 20 | 2 |
| 16 | 20 | 0 |
| 17 | 20 | −2 |
| 18 | 20 | −4 |
| 19 | 20 | −6 |
| 20 | 19 | −8 |
| ... | | |

Table 1 shows a portion of an exemplary look-up table for a 6-bit phase interpolator implementation having an amplitude range between −20 and 20. In some embodiments, the phase interpolator 105 can index into Table 1 based on a phase code received from the accumulator 104 or the invert logic 107. In an embodiment with a non-invertible quadrature clock generator, for example, the accumulator 104 can send a code "20" to the phase interpolator 105. The phase interpolator 105 can look up first and second factors A, B of 19 and −8, respectively. Accordingly, the phase interpolator 105 can multiply the $CLK_I$ signal by 19, multiply the $CLK_Q$ signal by −8, and sum the result according to Equation 1, above to determine $CLK_{INTERP}$.

In various implementations, the phase interpolator 105 can perform the multiplication using analog summation techniques. For example, according to Table 1, for each of the first and second factors A, B, the phase interpolator 105 can include 40 selectively enabled load devices (in differential implementations, 20 for each differential signal), for a total of 80 load devices. More generally, the phase interpolator 105 can include load devices numbering two times the maximum amplitude range. However, this approach can require a large amount of circuit area, draw a large amount of power, and increase the design considerations for driving devices.

In the illustrated implementation, the ISSQCG 106 is configured to selectively invert the $CLK_I$ and/or $CLK_Q$ signals. Accordingly, the phase interpolator 105 can be configured to index into a look-up table with only positive values. Table 2, below shows a portion of another exemplary look-up table for a 6-bit phase interpolator implementation having an amplitude range between 0 and 20. In an embodiment, the invert logic 107 is configured to send $INV_I$ and $INV_Q$ signals to the ISSQCG 106 as appropriate to correct the sign of the multiplication output from the phase interpolator 105. For example, according to the embodiment shown in Table 2, the invert logic 107 can be configured to assert $INV_Q$ to the ISSQCG 106 when the phase interpolator 105 indexes into phases 17, 18, 19, etc.

TABLE 2

| Phase | A | B |
|---|---|---|
| 0 | 0 | 20 |
| 1 | 2 | 20 |
| 2 | 4 | 20 |
| 3 | 6 | 20 |
| 4 | 8 | 19 |
| 5 | 9 | 17 |
| 6 | 11 | 17 |
| 7 | 13 | 16 |
| 8 | 14 | 14 |
| 9 | 16 | 13 |
| 10 | 17 | 11 |
| 11 | 17 | 9 |
| 12 | 19 | 8 |
| 13 | 20 | 6 |
| 14 | 20 | 4 |
| 15 | 20 | 2 |
| 16 | 20 | 0 |
| 17 | 20 | 2 |
| 18 | 20 | 4 |
| 19 | 20 | 6 |
| 20 | 19 | 8 |
| ... | | |

In another embodiment, in which the ISSQCG 106 is configured to selectively invert the $CLK_I$ and/or $CLK_Q$ signals, the phase interpolator 105 can be configured to index into a look-up table including negative values (for example, Table 1). The invert logic 107 can be configured to rewrite an index code received from the accumulator 104, causing the phase interpolator 105 to index into an equivalent phase having a positive sign. With respect to Table 1, for example, the accumulator 104 can transmit an index code 18 corresponding to first and second factors A, B, or 20 and −4, respectively. The invert logic 107 can be configured to rewrite the index code 18 as 14, corresponding to first and second factors A, B, or 20 and 4, respectively. At the same time, the invert logic 107 can be configured to assert $INV_Q$ to the ISSQCG 106.

In an embodiment, the invert logic 107 can be configured to modify the $INV_I$ signal only when the phase index corresponds to a first factor A within a first range. The first range can be, for example, 0 exactly, between −1 and 1, between −4 and 4, etc. Similarly, the invert logic 107 can be configured to modify the $INV_Q$ signal only when the phase index corresponds to a second factor B within a second range. The second range can be, for example, 0 exactly, between −1 and 1, between −4 and 4, etc. In various embodiments, limiting clock inversions to relatively low phase index values can reduce signal artifacts.

Although one implementation of the phase interpolator 105 has been described, other configurations can be used. In various other embodiments, look-up tables having all negative values can be used, or the phase interpolator 105 can omit the look-up table. In some embodiments, the phase interpolator 105 can include one or more additional load devices used for leakage cancellation. The phase interpolator 105 can generate the sampling clock signal $CLK_{SAMPLE}$ from the interpolated clock signal $CLK_{INTERP}$ in any suitable manner, such as by limiting the interpolated clock signal $CLK_{INTERP}$ to generate a square wave sampling clock signal suitable for capturing samples.

FIG. 7B is a graph illustrating one example of a timing diagram 120 for the CDR system 110 of FIG. 7A. The timing diagram 120 includes a first plot of a serial data stream received on the data input terminal $D_{IN}$ of FIG. 7A and a second plot of the sampling clock signal $CLK_{SAMPLE}$ of FIG. 7A. The timing diagram 120 has been annotated to illustrate sampling times of a first data sample 111*a*, a second data sample 111*b*, a first transition or edge sample 112*a*, and a second transition sample 112*b*. As shown in FIG. 7B, the timing diagram 120 illustrates a configuration in which the data sampling rate of the serial data stream is about equal to the frequency of the sampling clock signal $CLK_{SAMPLE}$. Thus, the timing diagram 120 illustrates timing data for a full-rate CDR system.

The timing diagram 120 illustrates a configuration in which data samples of the serial data stream are captured on rising edges of the sampling clock signal $CLK_{SAMPLE}$ and edge samples of the serial data stream are captured on falling edges of the sampling clock signal $CLK_{SAMPLE}$. However, other configurations of CDR systems can be used, such as implementations in which data samples are captured on falling edges of the sampling clock signal $CLK_{SAMPLE}$ and edge samples are captured on rising edges of the sampling clock signal $CLK_{SAMPLE}$.

Figure 8A:
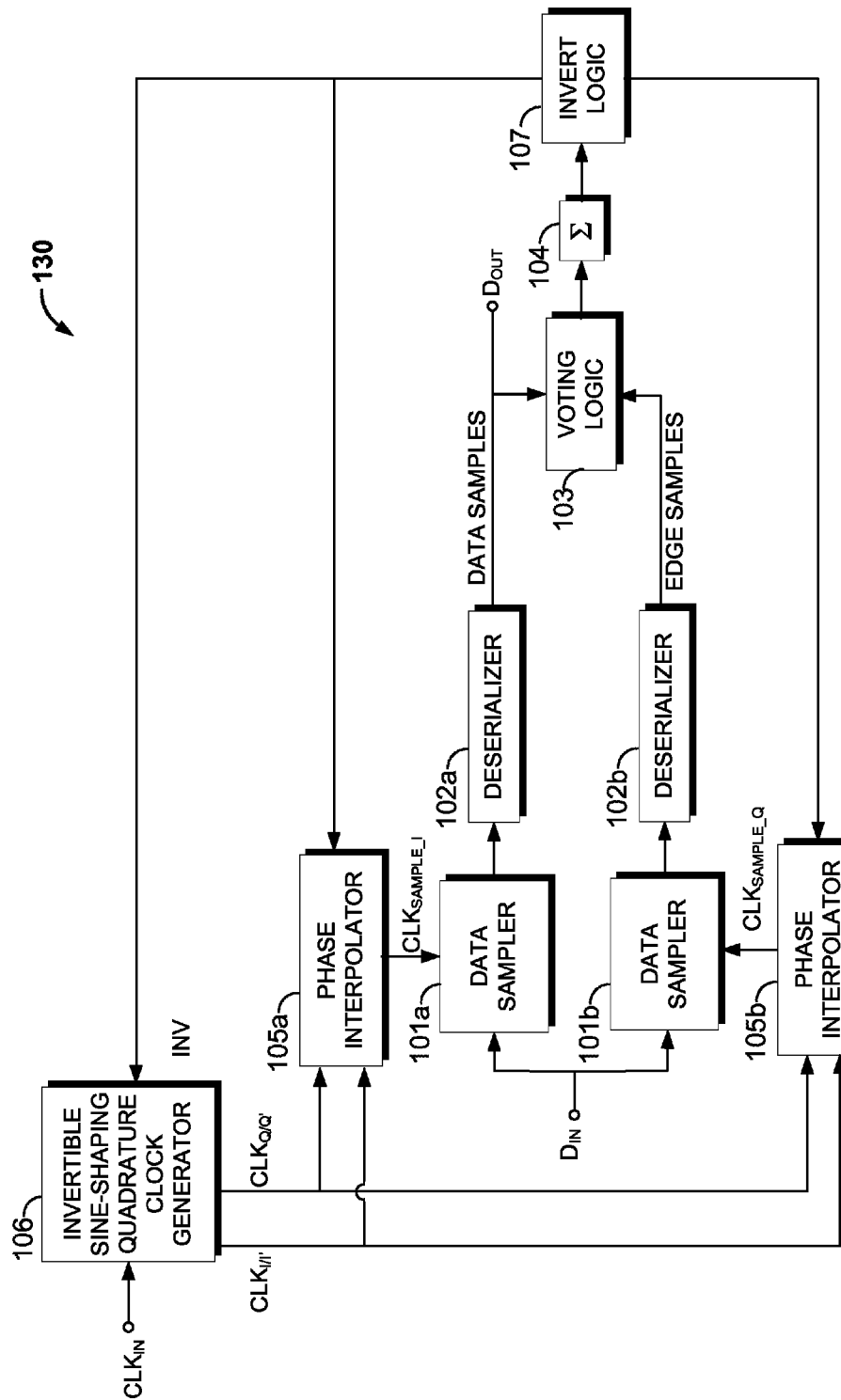
FIG. 8A is a schematic block diagram of another embodiment of a CDR system.

FIG. 8A is a schematic block diagram of another embodiment of a CDR system 130. The CDR system 130 includes first and second data samplers 101*a*, 101*b*, first and second deserializers 102*a*, 102*b*, the voting logic 103, the accumulator 104, first and second phase interpolators 105*a*, 105*b*, the invertible quadrature clock signal generator or invertible sine-shaping quadrature clock generator (ISSQCG) 106, and the invert logic 107. The CDR system 110 further includes the clock input terminal $CLK_{IN}$, the data input terminal $D_{IN}$, and the data output terminal $D_{OUT}$.

The CDR system 130 of FIG. 8A is similar to the CDR system 110 of FIG. 7A, except that the CDR system 130 is implemented in a half-rate configuration using two samplers and two phase interpolators. For example, the first data sampler 101*a* is configured to sample a serial data stream received on the data input terminal $D_{IN}$ on both rising and falling edges of an in-phase sampling clock signal $CLK_{SAMPLE\_I}$ to generate data samples for the first deserializer 102*a*. Additionally, the second data sampler 101b is configured to sample the serial data stream on both rising and falling edges of a quadrature-phase sampling clock signal $CLK_{SAMPLE\_Q}$ to generate edge samples for the second deserializer 102b.

As illustrated in FIG. 8A, the first phase interpolator 105a has been configured to generate the in-phase sampling clock signal $CLK_{SAMPLE\_I}$ and the second phase interpolator 105b has been configured to generate the quadrature-phase sampling clock signal $CLK_{SAMPLE\_Q}$. The first and second phase interpolators 105a, 105b can be configured to generate the in-phase and quadrature-phase sampling clock signals $CLK_{SAMPLE\_I}$, $CLK_{SAMPLE\_Q}$ by interpolating the in-phase and quadrature-phase sinusoidal reference clock signals $CLK_{I/I'}$, $CLK_{Q/Q'}$ generated by the invertible quadrature clock signal generator 106 based on control information received from the accumulator 104. In certain implementations, the first and second phase interpolators 105a, 105b can maintain a quadrature-phase relationship between the in-phase and quadrature-phase sampling clock signals $CLK_{SAMPLE\_I}$, $CLK_{SAMPLE\_Q}$ and can move the sampling clock signals in lock-step.

FIG. 8B is a graph illustrating one example of a timing diagram 140 for the CDR system 130 of FIG. 8A. The timing diagram 140 includes a first plot of a serial data stream received on the data input terminal $D_{IN}$ of FIG. 8A, a second plot of the in-phase sampling clock signal $CLK_{SAMPLE\_I}$ of FIG. 8A, and a third plot of the quadrature-phase sampling clock signal $CLK_{SAMPLE\_Q}$ of FIG. 8A. The timing diagram 140 has been annotated to illustrate sampling times of a first data sample 131a, a second data sample 131b, a first edge or transition sample 132a, and a second transition sample 132b. The timing diagram 140 illustrates a configuration of a half-rate CDR system.

Figure 9:
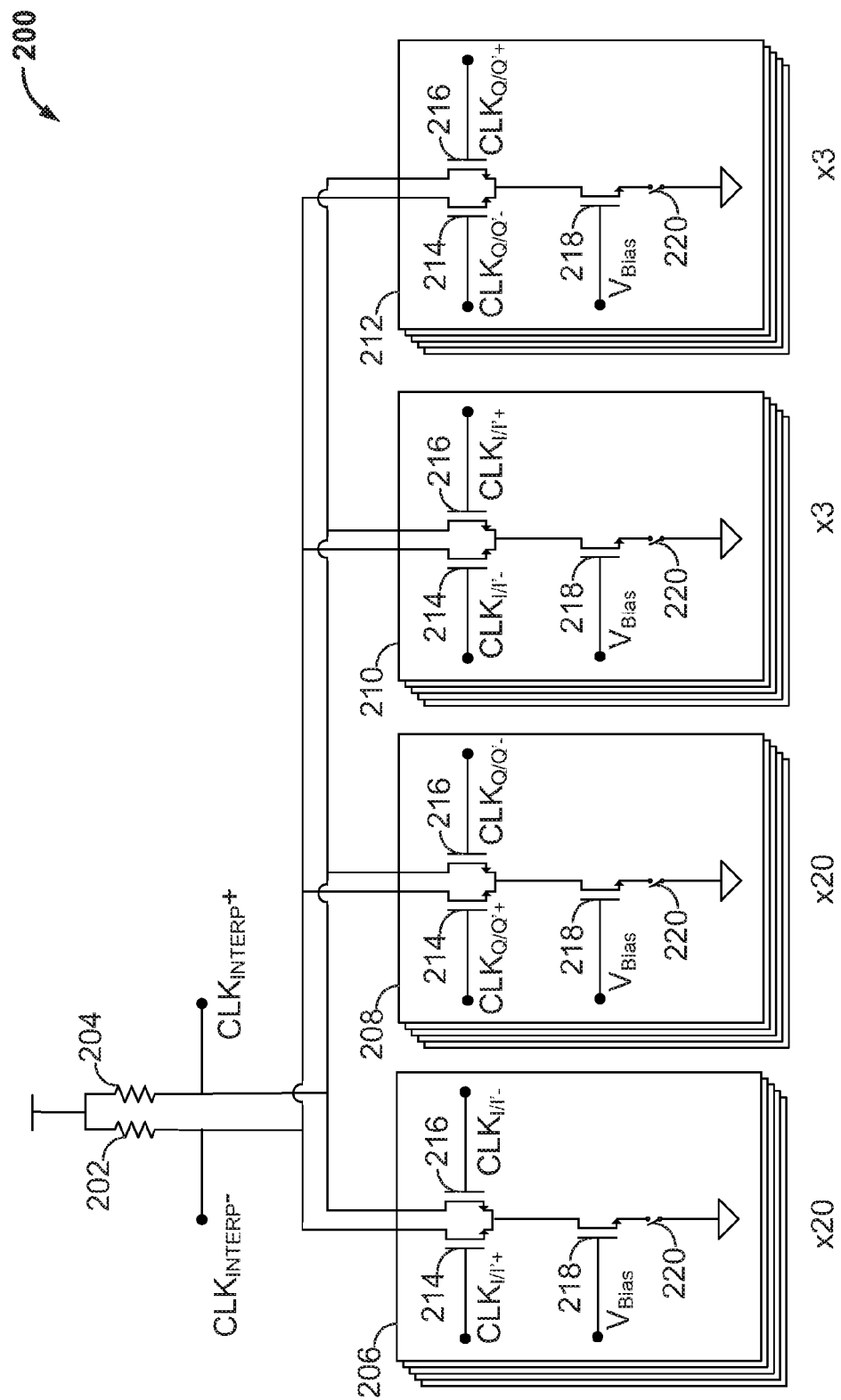
FIG. 9 is a circuit diagram illustrating one embodiment of a phase interpolator.

FIG. 9 is a circuit diagram illustrating one embodiment of a phase interpolator 200. The phase interpolator 200 includes first and second pull-up resistors 202, 204, first and second interpolated nodes $CLK_{INTERP}-$, $CLK_{INTERP}+$, an in-phase pull-down bank 206, a quadrature-phase pull-down bank 208, an in-phase leakage cancellation bank 210, and a quadrature-phase leakage cancellation bank 212. In various embodiments, the in-phase leakage cancellation bank 210, and the quadrature-phase leakage cancellation bank 212 can be omitted. The phase interpolator 200 illustrates one implementation of a differential phase interpolator in accordance with the teachings herein. For example, the phase interpolator 200 can implement the phase interpolator 105, discussed above with respect to FIGS. 7A and 8A.

The phase interpolator 200 is configured to generate a sampling clock signal $CLK_{SAMPLE}$ by interpolating the in-phase sinusoidal reference clock signal $CLK_{I/I'}$ and the quadrature-phase sinusoidal reference clock signal $CLK_{Q/Q'}$. The phase interpolator 200 can generate the first and second interpolated clock signals $CLK_{INTERP}-$, $CLK_{INTERP}+$ by selectively enabling one or more devices in the in-phase and quadrature-phase pull-down banks 206, 208. For example, the number of devices enabled in each bank can be set according to Tables 1 or 2, above, in conjunction with control signals from the invert logic 107 (FIG. 7A) or the accumulator 104 (FIG. 7A). The phase interpolator 200 can generate a sampling clock signal $CLK_{SAMPLE}$ from the first and second interpolated clock signals $CLK_{INTERP}-$, $CLK_{INTERP}+$ in any suitable manner, such as by limiting the first and second interpolated clock signals $CLK_{INTERP}-$, $CLK_{INTERP}+$ to generate a square wave sampling clock signal suitable for capturing samples.

Each bank 206, 208, 210, 212 includes a plurality of pull down devices each including first and second pull-down transistors 214, 216, a cascode transistor 218, and an enabling switch 220. The first pull-up resistor 202 is electrically connected between a voltage source and the first interpolated clock node $CLK_{INTERP}-$. The second pull-up resistor 204 is electrically connected between a voltage source and the second interpolated clock node $CLK_{INTERP}+$.

Each of the first pull-down transistors 214 in the banks 206, 208, 210, 212 include a source, a gate, and a drain. Although illustrated transistors 214 are N-type field effect transistors (FETs), a person having ordinary skill in the art will appreciate that other types of transistors can be used. The drain of each first pull-down transistor 214 is electrically connected to the first interpolated clock node $CLK_{INTERP}-$. The source of each first pull-down transistor 214 is electrically connected to the source of the second pull down transistor 216 and to the drain of the cascode transistor 218.

The gate of each first pull-down transistor 214 in the in-phase pull-down bank 206 is electrically connected to the first in-phase sinusoidal clock signal $CLK_{I/I}+$. The gate of each first pull-down transistor 214 in the quadrature-phase pull-down bank 208 is electrically connected to the first quadrature-phase sinusoidal clock signal $CLK_{Q/Q}+$. The gate of each first pull-down transistor 214 in the in-phase leakage cancellation bank 210 is electrically connected to the second in-phase sinusoidal clock signal $CLK_{I/I}-$. The gate of each first pull-down transistor 214 in the quadrature-phase leakage cancellation bank 212 is electrically connected to the second quadrature-phase sinusoidal clock signal $CLK_{I/I}-$.

Each of the second pull-down transistors 216 in the banks 206, 208, 210, 212 include a source, a gate, and a drain. Although illustrated transistors 216 are N-type field effect transistors (FETs), a person having ordinary skill in the art will appreciate that other types of transistors can be used. The drain of each second pull-down transistor 216 is electrically connected to the first interpolated clock node $CLK_{INTERP}-$. The source of each second pull-down transistor 216 is electrically connected to the source of the first pull down transistor 214 and to the drain of the cascode transistor 218.

The gate of each second pull-down transistor 216 in the in-phase pull-down bank 206 is electrically connected to the second in-phase sinusoidal clock signal $CLK_{I/I}-$. The gate of each second pull-down transistor 216 in the quadrature-phase pull-down bank 208 is electrically connected to the second quadrature-phase sinusoidal clock signal $CLK_{Q/Q}-$. The gate of each second pull-down transistor 216 in the in-phase leakage cancellation bank 210 is electrically connected to the first in-phase sinusoidal clock signal $CLK_{I/I}+$. The gate of each second pull-down transistor 216 in the quadrature-phase leakage cancellation bank 212 is electrically connected to the first quadrature-phase sinusoidal clock signal $CLK_{I/I}+$.

Each of the cascode transistors 218 in the banks 206, 208, 210, 212 include a source, a gate, and a drain. Although illustrated transistors 218 are N-type field effect transistors (FETs), a person having ordinary skill in the art will appreciate that other types of transistors can be used. The drain of each cascode transistor 218 is electrically connected to the first interpolated clock node $CLK_{INTERP}-$. The source of each cascode transistor 218 is electrically connected to the enabling switch 220. The gate of each cascode transistor 218 is electrically connected to a bias voltage $V_{Bias}$.

Each enabling switch 220 in the banks 206, 208, 210, 212 is connected between the cascode transistor 218 and ground. Each enabling switch 220 can be independently controlled to perform interpolation at the differential interpolated clock nodes $CLK_{INTERP}+$, $CLK_{INTERP}-$. In the illustrated embodiment, the in-phase pull-down bank 206 includes 20 pull-down devices, the quadrature-phase pull-down bank 208 includes 20 pull-down devices, the in-phase leakage cancellation bank 210 includes 3 pull-down devices, and the quadrature-phase leakage cancellation bank 212 includes 3 pull-down devices. In some embodiments, the phase interpolator 200 in a CDR system including invertible in-phase and quadrature-phase clock inputs $CLK_{I/I'}$, $CLK_{Q/Q'}$ can include fewer devices than a phase interpolator in a CDR system that does not include invertible clock inputs. A person having ordinary skill in the art will appreciate that the banks 206, 208, 210, 212 can be different sizes, and in some embodiments, omitted.

In some embodiments, the in-phase and quadrature-phase pull-down banks 206, 208 can have a leakage current, even when all enabling switches 220 are open. In the illustrated embodiment, the leakage cancellation banks 210, 212 are configured with opposite polarity with respect to the pull-down banks 206, 208. Accordingly, one or more devices in the leakage cancellation banks 210, 212 can be enabled in order to cancel the leakage current in the pull-down banks 206, 208. As discussed above, in some embodiments, the leakage cancellation banks 210, 212 are omitted.

Although FIG. 9 illustrates one configuration of the phase interpolator 200 suitable for use in the clock and data recovery system described herein, other implementations of phase interpolators can be used.

Figure 10:
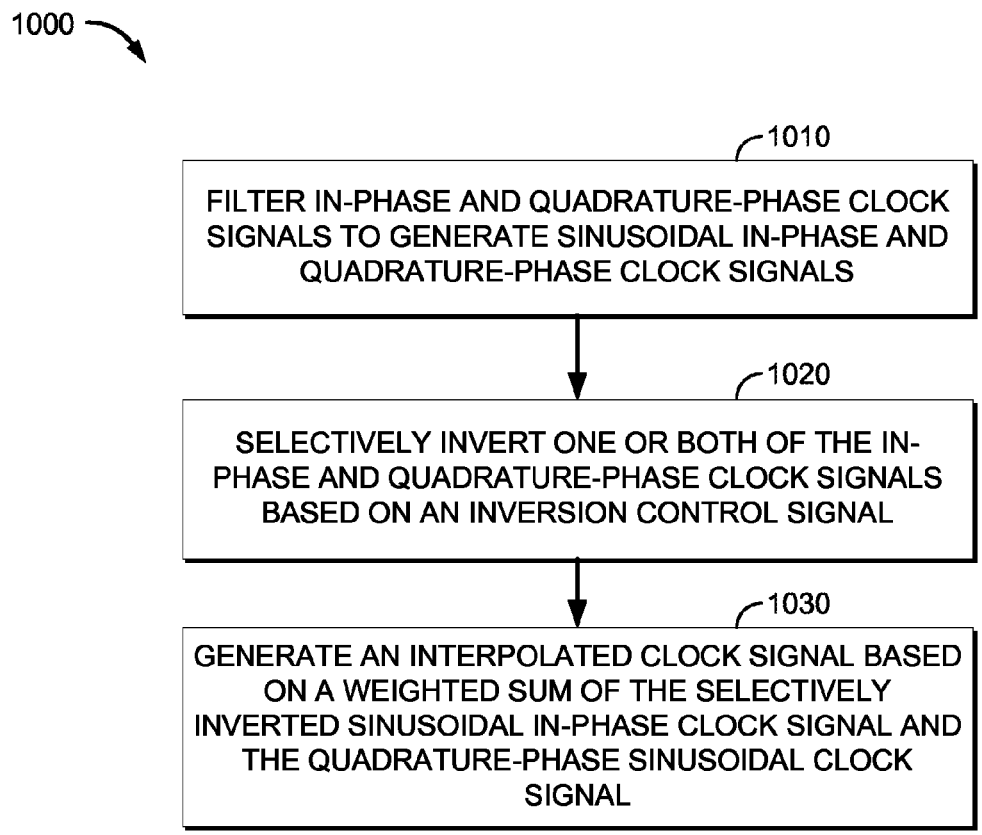
FIG. 10 is a flowchart of an exemplary process of quadrature clock generation.

FIG. 10 is a flowchart 1000 of an exemplary process of quadrature clock generation. Although the process of flowchart 1000 is described herein with reference to the invertible quadrature clock signal generator 20 discussed above with respect to FIG. 1C, and the clock and data recovery (CDR) system 110 discussed above with respect to FIG. 7A, a person having ordinary skill in the art will appreciate that the process of flowchart 1000 can be implemented by another device described herein, or any other suitable device. In an embodiment, the steps in flowchart 1000 can be performed by a processor or controller. Although the process of flowchart 1000 is described herein with reference to a particular order, in various embodiments, blocks herein can be performed in a different order, or omitted, and additional blocks can be added.

First, at block 1010, the process filters in-phase and quadrature-phase clock signals to generate sinusoidal in-phase and quadrature-phase clock signals. For example, the invertible sine-shaping filter 6 can receive the in-phase clock signal $CLK_I$ and the quadrature-phase clock signal $CLK_Q$ from the quadrature clock divider 5. The invertible sine-shaping filter 6 can filter the in-phase clock signal $CLK_I$ and the quadrature-phase clock signal $CLK_Q$ into sinusoidal in-phase and quadrature-phase clock signals. The in-phase clock signal and the quadrature-phase clock signal can have a quadrature-phase relationship.

In an embodiment, the process can buffer the in-phase clock signal to generate an in-phase sinusoidal reference clock signal and can buffer the quadrature-phase clock signal to generate a quadrature-phase sinusoidal reference clock signal. The in-phase sinusoidal reference clock signal and the quadrature-phase sinusoidal reference clock signal have a quadrature-phase relationship.

In an embodiment, the process can generate the inversion control signal based on the serial data stream. For example, the invert logic 107 can generate the inversion control signal INV, which can include $INV_I$ and/or $INV_Q$. The inversion control signal INV can be based on the data sampled by the data sampler 101. For example, the voting logic 103 and the accumulator 104 can process the sampled data. The invert logic 107 can modify the inversion control signal only when a weight value is within a threshold range, such as when a first or second value A or B is near or crossing a zero value.

Next, at block 1020, the process selectively inverts one or both of the in-phase and quadrature-phase clock signals based on an inversion control signal. For example, the invertible sine-shaping filter 6 can receive the in-phase clock inversion signal $INV_I$ and/or the quadrature-phase clock inversion input signal $INV_Q$. When the in-phase clock inversion signal $INV_I$ is asserted, the invertible sine-shaping filter 6 can invert the in-phase clock signal $CLK_I$. Similarly, when the quadrature-phase clock inversion signal $INV_Q$ is asserted, the invertible sine-shaping filter 6 can invert the quadrature-phase clock signal $CLK_Q$.

Then, at block 1030, the process generates an interpolated clock signal based on a weighted sum of the selectively inverted sinusoidal in-phase clock signal and the quadrature-phase sinusoidal clock signal. For example, the phase interpolator 105 can receive the in-phase clock signal $CLK_{I/I'}$ and the quadrature-phase clock signal $CLK_{Q/Q'}$ from the ISSQCG 106. In an embodiment, the ISSQCG 106 can include the invertible sine-shaping filter 6. The phase interpolator 105 can generate the $CLK_{SAMPLE}$ signal based on the in-phase clock signal $CLK_{I/I'}$ and the quadrature-phase clock signal $CLK_{Q/Q'}$, as discussed above with respect to Tables 1 and 2 and Equations 1 and 2.

In an embodiment, the process can further generate a sampling clock signal based on the interpolated clock signal. The process can sample a serial data stream using the sampling clock signal. For example, the data sampler 101 can receive the serial data stream $D_{IN}$ and can sample $D_{IN}$ based on the $CLK_{SAMPLE}$ signal received from the phase interpolator 105.

In an embodiment, the process can further determine one or more weight values based on the serial data stream. For example, phase interpolator 105 can generate the $CLK_{SAMPLE}$ signal based on the in-phase clock signal $CLK_{I/I'}$ and the quadrature-phase clock signal $CLK_{Q/Q'}$, as discussed above with respect to Tables 1 and 2 and Equations 1 and 2. For example, the voting logic 103 and the accumulator 104 can process the sampled data. The invert logic 107 can modify the inversion control signal only when a weight value is within a threshold range, such as when a first or second value A or B is near or crossing a zero value. The phase interpolator 105 can generate the $CLK_{SAMPLE}$ signal based on the output from any of the voting logic 103, the accumulator 104, and the invert logic 107.

In an embodiment, the in-phase and quadrature-phase clock signals, the sinusoidal in-phase and quadrature-phase clock signals, and the selectively inverted sinusoidal in-phase and quadrature-phase clock signals are differential signals. The process can generate an in-phase clock signal and a quadrature-phase clock signal from a sinusoidal clock signal using a polyphase filter. For example, the quadrature clock divider 5 can generate the in-phase clock signal $CLK_I$ and the quadrature-phase clock signal $CLK_Q$.

In an embodiment, the clock input signal can be one of a square wave clock input signal or a rectangular wave clock input signal. The clock input signal can have a first period, and the in-phase sinusoidal clock signal and the quadrature-phase sinusoidal clock signal can each have a period about equal to the first period. The in-phase sinusoidal clock signal and the quadrature-phase sinusoidal clock signal can have a phase difference about equal to one quarter of the first period.

Figure 11:
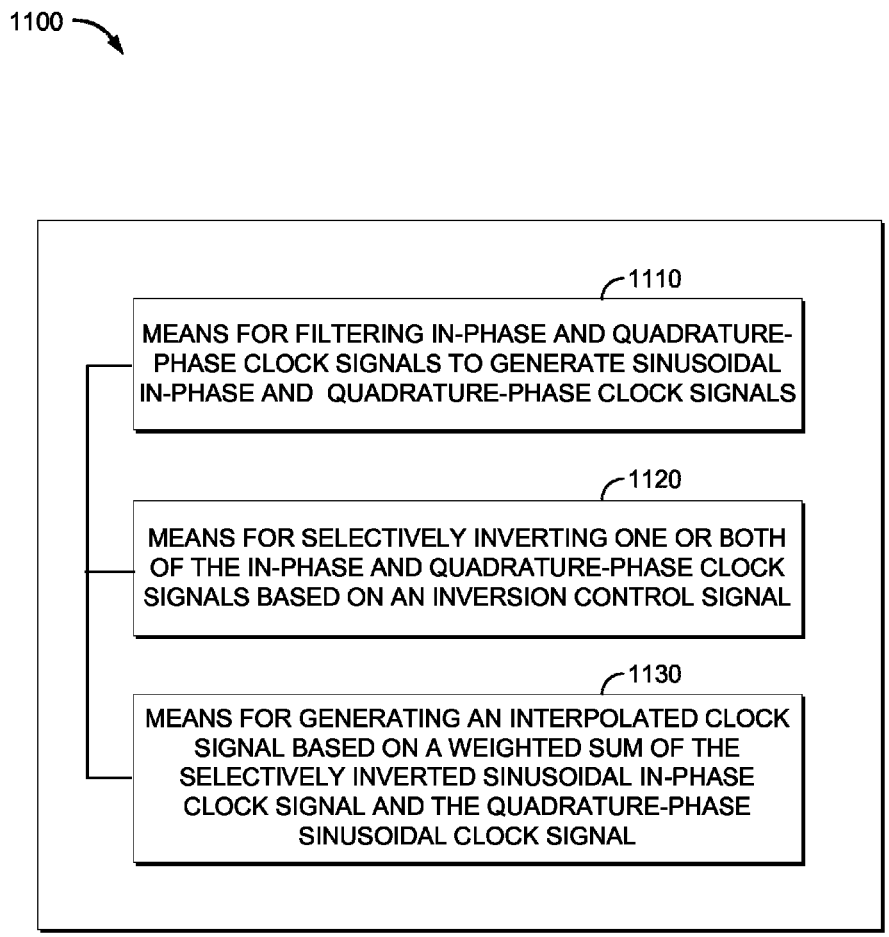
FIG. 11 is a functional block diagram of an apparatus for clock signal generation, in accordance with an embodiment of the invention.

FIG. 11 is a functional block diagram of an apparatus for clock signal generation 1100, in accordance with an embodiment of the invention. Those skilled in the art will appreciate that an apparatus for clock signal generation can have more components than the simplified apparatus 1100 shown in FIG. 11. The apparatus for detecting clock signal generation 1100 shown includes only those components useful for describing some prominent features of implementations within the scope of the claims. The apparatus for clock signal generation 1100 includes means 1110 for filtering in-phase and quadrature-phase clock signals to generate sinusoidal in-phase and quadrature-phase clock signals, means 1120 for selectively inverting one or both of the in-phase and quadrature-phase clock signals based on an inversion control signal, and means 1130 for generating an interpolated clock signal based on a weighted sum of the selectively inverted sinusoidal in-phase clock signal and the quadrature-phase sinusoidal clock signal.

In an embodiment, means 1110 for filtering in-phase and quadrature-phase clock signals to generate sinusoidal in-phase and quadrature-phase clock signals can be configured to perform one or more of the functions described above with respect to block 1010 (FIG. 10). In various embodiments, the means 1110 for filtering in-phase and quadrature-phase clock signals to generate sinusoidal in-phase and quadrature-phase clock signals can be implemented by one or more of the sine-shaping filter 1 (FIGS. 1A-1B), the inverting buffers 3 (FIGS. 1A-2B), the invertible sine-shaping filter 6 (FIG. 1C), and the ISSQCG 106 (FIGS. 7A and 8A).

In an embodiment, means 1120 for selectively inverting one or both of the in-phase and quadrature-phase clock signals based on an inversion control signal can be configured to perform one or more of the functions described above with respect to block 1020 (FIG. 10). In various embodiments, the means 1120 for selectively inverting one or both of the in-phase and quadrature-phase clock signals based on an inversion control signal can be implemented by one or more of the inverting buffers 3 (FIGS. 1A-2B), the invertible sine-shaping filter 6 (FIG. 1C), and the ISSQCG 106 (FIGS. 7A and 8A).

In an embodiment, means 1130 for generating an interpolated clock signal based on a weighted sum of the selectively inverted sinusoidal in-phase clock signal and the quadrature-phase sinusoidal clock signal can be configured to perform one or more of the functions described above with respect to block 1030 (FIG. 10). In various embodiments, the means 1130 for generating an interpolated clock signal based on a weighted sum of the selectively inverted sinusoidal in-phase clock signal and the quadrature-phase sinusoidal clock signal can be implemented by one or more of the phase interpolator 105 (FIG. 7A) and the phase interpolators 105a-105b (FIG. 8A).

The foregoing description and claims can refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components can be present in an actual embodiment (assuming that the functionality of the depicted circuits is not adversely affected).

Applications

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

The various operations of methods described above can be performed by any suitable means capable of performing the operations, such as various hardware and/or software component(s), circuits, and/or module(s). Generally, any operations illustrated in the Figures can be performed by corresponding functional means capable of performing the operations.

Information and signals can be represented using any of a variety of different technologies and techniques. For example, data, instructions, commands, information, signals, bits, symbols, and chips that can be referenced throughout the above description can be represented by voltages, currents, electromagnetic waves, magnetic fields or particles, optical fields or particles, or any combination thereof.

The various illustrative logical blocks, modules, circuits, and algorithm steps described in connection with the embodiments disclosed herein can be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the embodiments of the invention.

The various illustrative blocks, modules, and circuits described in connection with the embodiments disclosed herein can be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The steps of a method or algorithm and functions described in connection with the embodiments disclosed herein can be embodied directly in hardware, in a software module executed by a processor, or in a combination of the two. If implemented in software, the functions can be stored on or transmitted over as one or more instructions or code on a tangible, non-transitory computer-readable medium. A software module can reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art. A storage medium is coupled to the processor such that the processor can read information from, and write information to, the storage medium. In the alternative, the storage medium can be integral to the processor. Disk and disc, as used herein, includes compact disc (CD), laser disc, optical disc, digital versatile disc (DVD), floppy disk and blu ray disc where disks usually reproduce data magnetically, while discs reproduce data optically with lasers. Combinations of the above should also be included within the scope of computer readable media. The processor and the storage medium can reside in an ASIC. The ASIC can reside in a user terminal. In the alternative, the processor and the storage medium can reside as discrete components in a user terminal.

For purposes of summarizing the disclosure, certain aspects, advantages and novel features of the inventions have been described herein. It is to be understood that not necessarily all such advantages can be achieved in accordance with any particular embodiment of the invention. Thus, the invention can be embodied or carried out in a manner that achieves or optimizes one advantage or group of advantages as taught herein without necessarily achieving other advantages as can be taught or suggested herein.

Various modifications of the above described embodiments will be readily apparent, and the generic principles defined herein can be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   an invertible sine-shaping filter configured to:
   receive an in-phase clock signal, a quadrature-phase clock signal, and an inversion control signal;
   filter the in-phase and quadrature-phase clock signals to generate sinusoidal in-phase and quadrature-phase clock signals; and
   selectively invert one or both of the in-phase and quadrature-phase clock signals based on an inversion control signal; and
   a phase interpolator configured to generate an interpolated clock signal based on a weighted sum of the selectively inverted sinusoidal in-phase clock signal and the quadrature-phase sinusoidal clock signal,
   wherein the in-phase clock signal and the quadrature-phase clock signal have a quadrature-phase relationship.

2. The apparatus of claim 1, wherein the invertible sine-shaping filter comprises a buffer circuit configured to buffer the in-phase clock signal to generate an in-phase sinusoidal reference clock signal and to buffer the quadrature-phase clock signal to generate a quadrature-phase sinusoidal reference clock signal, wherein the in-phase sinusoidal reference clock signal and the quadrature-phase sinusoidal reference clock signal have a quadrature-phase relationship.

3. The apparatus of claim 1, further comprising a sampler configured to receive a serial data stream and to sample the serial data stream on at least one of a rising edge of a sampling clock signal and a falling edge of the sampling clock signal, wherein the phase interpolator is configured to generate the sampling clock signal based on the interpolated clock signal.

4. The apparatus of claim 3, further comprising an invert logic circuit configured to generate the inversion control signal based on the serial data stream.

5. The apparatus of claim 4, wherein the invert logic circuit is configured to modify the inversion control signal only when a weight value of the phase interpolator is within a threshold range.

6. The apparatus of claim 1, wherein the phase interpolator is further configured to determine one or more weight values based on the serial data stream.

7. The apparatus of claim 1, wherein the in-phase and quadrature-phase clock signals, the sinusoidal in-phase and quadrature-phase clock signals, and the selectively inverted sinusoidal in-phase and quadrature-phase clock signals are differential signals.

8. The apparatus of claim 1, further comprising a polyphase filter configured to receive a sinusoidal clock signal and to generate the in-phase clock signal and the quadrature-phase clock signal based on a sinusoidal clock signal.

9. The apparatus of claim 8, wherein the clock input signal is one of a square wave clock input signal or a rectangular wave clock input signal, wherein the clock input signal has a first period, and wherein the in-phase sinusoidal clock signal and the quadrature-phase sinusoidal clock signal each have a period about equal to the first period, and wherein the in-phase sinusoidal clock signal and the quadrature-phase sinusoidal clock signal have a phase difference about equal to one-quarter of the first period.

10. The apparatus of claim 1, further comprising a regulator configured to generate a regulated voltage, wherein the regulator is configured to power at least a portion of the invertible sine-shaping filter using the regulated voltage.

11. A method of clock signal generation, the method comprising:
   filtering in-phase and quadrature-phase clock signals to generate sinusoidal in-phase and quadrature-phase clock signals;
   selectively inverting one or both of the in-phase and quadrature-phase clock signals based on an inversion control signal; and
   generating an interpolated clock signal based on a weighted sum of the selectively inverted sinusoidal in-phase clock signal and the quadrature-phase sinusoidal clock signal,
   wherein the in-phase clock signal and the quadrature-phase clock signal have a quadrature-phase relationship.

12. The method of claim 11, further comprising:
   buffering the in-phase clock signal to generate an in-phase sinusoidal reference clock signal; and
   buffering the quadrature-phase clock signal to generate a quadrature-phase sinusoidal reference clock signal,
   wherein the in-phase sinusoidal reference clock signal and the quadrature-phase sinusoidal reference clock signal have a quadrature-phase relationship.

13. The method of claim 11, further comprising generating a sampling clock signal based on the interpolated clock signal and sampling a serial data stream using the sampling clock signal.

14. The method of claim 13, further comprising generating the inversion control signal based on the serial data stream.

15. The method of claim 14, further comprising modifying the inversion control signal only when a weight value is within a threshold range.

16. The method of claim 11, further comprising determining one or more weight values based on the serial data stream.

17. The method of claim 11, wherein the in-phase and quadrature-phase clock signals, the sinusoidal in-phase and quadrature-phase clock signals, and the selectively inverted sinusoidal in-phase and quadrature-phase clock signals are differential signals.

18. The method of claim 11, further comprising generating an in-phase clock signal and a quadrature-phase clock signal from a sinusoidal clock signal using a polyphase filter.

19. The method of claim 18, wherein the clock input signal is one of a square wave clock input signal or a rectangular wave clock input signal, wherein the clock input signal has a first period, and wherein the in-phase sinusoidal clock signal and the quadrature-phase sinusoidal clock signal each have a period about equal to the first period, and wherein the in-phase sinusoidal clock signal and the quadrature-phase sinusoidal clock signal have a phase difference about equal to one-quarter of the first period.

20. The method of claim 11, further comprising generating a regulated voltage configured to power at least a portion of an invertible sine-shaping filter using the regulated voltage.

21. An apparatus for clock signal generation, comprising:
- means for filtering in-phase and quadrature-phase clock signals to generate sinusoidal in-phase and quadrature-phase clock signals;
- means for selectively inverting one or both of the in-phase and quadrature-phase clock signals based on an inversion control signal; and
- means for generating an interpolated clock signal based on a weighted sum of the selectively inverted sinusoidal in-phase clock signal and the quadrature-phase sinusoidal clock signal,
- wherein the in-phase clock signal and the quadrature-phase clock signal have a quadrature-phase relationship.

\* \* \* \* \*